(12) United States Patent
Kawakami et al.

(10) Patent No.: US 11,923,170 B2
(45) Date of Patent: Mar. 5, 2024

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventors: Satoru Kawakami, Nirasaki (JP); Hiroyuki Yamamoto, Nirasaki (JP); Taro Ikeda, Nirasaki (JP); Masaki Hirayama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 454 days.

(21) Appl. No.: 17/311,183

(22) PCT Filed: Nov. 26, 2019

(86) PCT No.: PCT/JP2019/046225
§ 371 (c)(1),
(2) Date: Jun. 4, 2021

(87) PCT Pub. No.: WO2020/116251
PCT Pub. Date: Jun. 11, 2020

(65) Prior Publication Data
US 2022/0037118 A1    Feb. 3, 2022

(30) Foreign Application Priority Data

Dec. 6, 2018 (JP) ................................. 2018-229224

(51) Int. Cl.
*C23F 1/08* (2006.01)
*H01J 37/32* (2006.01)

(52) U.S. Cl.
CPC .. *H01J 37/32082* (2013.01); *H01J 37/32449* (2013.01); *H01J 37/32559* (2013.01);
(Continued)

(58) Field of Classification Search
CPC ........... H01J 37/32082; H01J 37/32449; H01J 37/32559; H01J 37/32568;
(Continued)

(56) References Cited

U.S. PATENT DOCUMENTS

| 8,925,351 | B2 * | 1/2015 | Tian .................... H01J 37/3244 |
| | | | 156/345.33 |
| 2002/0104482 | A1 * | 8/2002 | Kazumi ............ H01J 37/32082 |
| | | | 118/500 |

(Continued)

FOREIGN PATENT DOCUMENTS

| JP | 2000-323456 A | 11/2000 |
| JP | 2004-363552 A | 12/2004 |

(Continued)

*Primary Examiner* — Elmito Breval
(74) *Attorney, Agent, or Firm* — Nath, Goldberg & Meyer; Jerald L. Meyer; Tanya E. Harkins

(57) ABSTRACT

The plasma processing apparatus according to an exemplary embodiment includes a processing container, a stage, an upper electrode, a dielectric plate, and a waveguide. The stage is provided in the processing container. The dielectric plate is provided above the stage with a space in the processing container interposed therebetween. The upper electrode is provided above the dielectric plate. The waveguide has an end and guides high frequency waves in a VHF band or a UHF band. The end is arranged to face the space to radiate high frequency waves to the space. The dielectric plate includes a conductive film. The conductive film is provided on an upper surface of the dielectric plate. The upper surface faces the upper electrode. The conductive film is electrically connected to the upper electrode.

20 Claims, 11 Drawing Sheets

(52) U.S. Cl.
CPC .. *H01J 37/32568* (2013.01); *H01J 37/32577* (2013.01); *H01J 37/32651* (2013.01)

(58) Field of Classification Search
CPC ........... H01J 37/32577; H01J 37/32651; H01J 37/32229; H01J 37/3244; H01J 37/32541; H01J 37/32715; H05H 1/46
See application file for complete search history.

(56) References Cited

U.S. PATENT DOCUMENTS

| | | | |
|---|---|---|---|
| 2011/0162799 A1* | 7/2011 | Hayashi .............. | H01J 37/3255 156/345.43 |
| 2014/0335288 A1* | 11/2014 | Hirayama ......... | H01J 37/32577 118/723 R |
| 2014/0368110 A1* | 12/2014 | Hirayama ......... | H01J 37/32577 315/39 |

FOREIGN PATENT DOCUMENTS

| | | | |
|---|---|---|---|
| JP | 2005-228973 A | 8/2005 |
| JP | 2007-5456 A | 1/2007 |
| JP | 2010-135813 A | 6/2010 |
| JP | 2011-138908 A | 7/2011 |
| JP | 2011-171750 A | 9/2011 |
| JP | 2017-143065 A | 8/2017 |
| JP | 2018-6718 A | 1/2018 |
| JP | 2018-85372 A | 5/2018 |

\* cited by examiner

PLASMA PROCESSING APPARATUS AND PLASMA PROCESSING METHOD

This is a National Phase Application filed under 35 U.S.C. 371 as a national stage of PCT/JP2019/046225, filed Nov. 26, 2019, an application claiming the benefit of Japanese Application No. 2018-229224, filed Dec. 6, 2018, the content of each of which is hereby incorporated by reference in its entirety.

TECHNICAL FIELD

The present disclosure relates to a plasma processing apparatus and a plasma processing method.

BACKGROUND

Techniques regarding a plasma processing apparatus used in manufacturing an electronic device are disclosed in, for example, Patent Documents 1 to 5. The plasma processing apparatus includes a vacuum container, a processing chamber, a support electrode, an antenna, a radiation port and a magnetic field forming means. The processing chamber is provided inside the vacuum container and is supplied with gases. The support electrode is provided in the processing chamber to support a processing target object. The antenna and radiation port are configured to supply a high frequency power of a very high frequency (VHF) band or an ultra-high frequency (UHF) band to the processing chamber. The magnetic field forming means is configured to form a magnetic field in the processing chamber. The plasma processing apparatus includes an electric field control space. The electric field control space is defined by a dielectric body and a metal partition plate or a disk-shaped metal surrounding the dielectric body. The VHF band is a frequency band in the range of about 30 to 300 MHz. The UHF band is a frequency band in the range of about 300 MHz to 3 GHz.

PRIOR ART DOCUMENTS

Patent Documents

Patent Document 1: Japanese laid-open publication No. 2000-323456
Patent Document 2: Japanese laid-open publication No. 2005-228973
Patent Document 3: Japanese laid-open publication No. 2010-135813
Patent Document 4: Japanese laid-open publication No. 2011-171750
Patent Document 5: Japanese laid-open publication No. 2011-138908

The present disclosure provides a technique that can improve plasma uniformity in a parallel plate type plasma processing apparatus whose plasma excitation frequency is in a VHF band or a UHF band.

SUMMARY

In an exemplary embodiment of the present disclosure, a plasma processing apparatus is provided. The plasma processing apparatus includes a processing container, a stage, an upper electrode, a dielectric plate, and a waveguide. The stage is provided in the processing container. The dielectric plate is provided above the stage with a space interposed therebetween in the processing container. The upper electrode is provided above the dielectric plate. The waveguide has an end and guides high frequency waves in a VHF band or a UHF band. The end is arranged to face the space and radiates high frequency waves to the space. The dielectric plate includes a conductive film. The conductive film is provided on an upper surface of the dielectric plate. The upper surface faces the upper electrode. The conductive film is electrically connected to the upper electrode.

According to the present disclosure, the present disclosure provides a technique that can improve plasma uniformity in a parallel plate type plasma processing apparatus whose plasma excitation frequency is in a VHF band or a UHF band.

DETAILED DESCRIPTION

Figure 1:
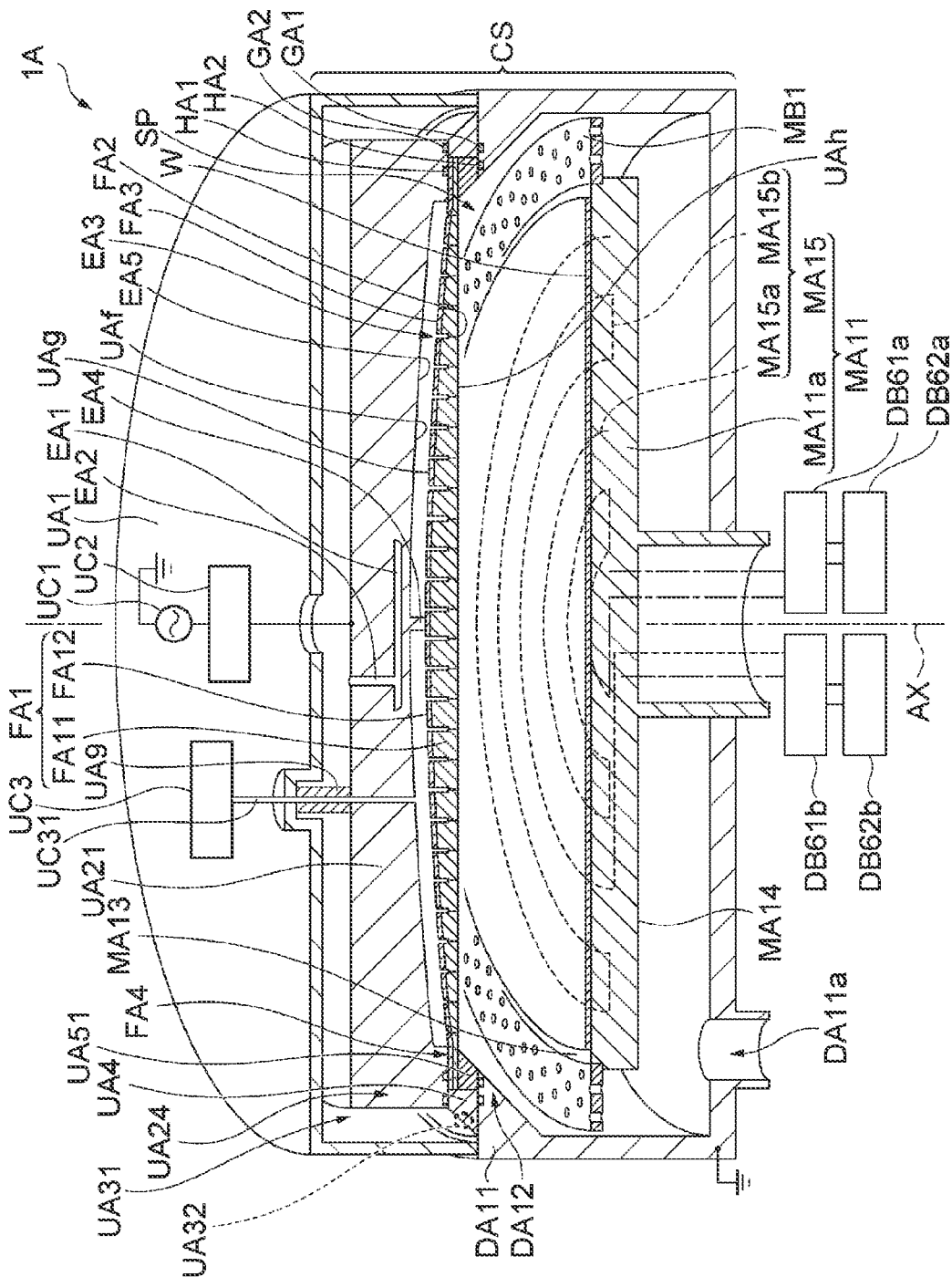
FIG. 1 is a diagram showing a configuration of a plasma processing apparatus according to an exemplary embodiment.

Hereinafter, various exemplary embodiments of the present disclosure will be described. In the exemplary embodiments, a plasma processing apparatus is provided. The plasma processing apparatus includes a processing container, a stage, an upper electrode, a dielectric plate and a waveguide. The stage is provided in the processing container. The dielectric plate is provided above the stage with a space interposed therebetween in the processing container. The upper electrode is provided above the dielectric plate. The waveguide has an end and guides high frequency waves in a VHF band or a UHF band. The end is arranged to face the space to radiate the high frequency into the space. The dielectric plate includes a conductive film. The conductive film is provided on the upper surface of the dielectric plate. The upper surface faces the upper electrode. The conductive film is electrically connected to the upper electrode.

In the case of the high frequency in the VHF band or the UHF band, the generation of standing waves may reduce the uniformity of plasma in the direction in which the lower surface of the dielectric plate extends. However, according to the exemplary embodiment, the dielectric plate provided below the upper electrode includes a conductive film which is provided on the upper surface of the dielectric plate and electrically connected to the upper electrode. Therefore, the dielectric plate, in the high frequency waves, may function as a capacitor connected to the upper electrode. Accordingly, the generation of standing waves can be suppressed, and the gradient of the electric field in the vicinity of the upper electrode (more specifically, the dielectric plate) in the space can be reduced. Therefore, it is possible to improve the uniformity of plasma.

In the plasma processing apparatus according to the exemplary embodiment, the dielectric plate has a thickness distribution in the radial direction of the dielectric plate. Therefore, the thickness of the dielectric plate has a thickness distribution (has a non-uniform thickness) in the radial direction of the dielectric plate (direction in which the dielectric plate extends). That is, the thickness of the dielectric plate may be adjusted so as to suppress the generation of standing waves. In particular, when the high frequency in the VHF band or the UHF band is radiated into the space, the thickness of the dielectric plate can be adjusted. By this adjustment, the wavelength of the surface wave (radio wave) propagating between the upper electrode (more specifically, the dielectric plate) and the plasma generated in the space at the time of plasma generation can be suitably extended. Accordingly, it is possible to further improve the uniformity of plasma.

In the plasma processing apparatus according to the exemplary embodiment, the thickness of the dielectric plate increases from the peripheral edge to the center of the dielectric plate. Accordingly, it is possible to suppress the generation of standing waves due to the surface wave.

In the plasma processing apparatus according to the exemplary embodiment, the thickness of the dielectric plate decreases from the peripheral edge to the center of the dielectric plate. Accordingly, it is possible to suppress the attenuation of a surface wave.

In the plasma processing apparatus according to the exemplary embodiment, the upper surface of the dielectric plate has a wavy shape. Accordingly, it is possible to reduce the influence of harmonics caused by the non-linear current-voltage characteristics of the plasma sheath.

In the plasma processing apparatus according to the exemplary embodiment, the upper electrode includes a protrusion. The protrusion is provided between the upper electrode and the dielectric plate. The protrusion is thermally connected to the dielectric plate. A heat dissipation path from the dielectric plate to the upper electrode is stably secured by the protrusion.

In the plasma processing apparatus according to the exemplary embodiment, the dielectric plate is a shower plate. Since the dielectric plate is a shower plate, a gas can be supplied to the space from the lower surface of the dielectric plate.

In the plasma processing apparatus according to the exemplary embodiment, the dielectric plate has gas discharge holes. The gas discharge holes include upper holes and lower holes that communicate with each other. The gas discharge holes penetrate the dielectric plate from the upper surface to the lower surface. The upper holes are provided on the upper surface. The lower holes are provided on the lower surface of the dielectric plate exposed to the space. The diameter of the upper holes is larger than the diameter of the lower holes. In the gas discharge holes, the lengths of the lower holes are aligned with each other. Accordingly, it is possible to suitably adjust the gas flow conductance.

The plasma processing apparatus according to the exemplary embodiment further includes a high frequency shield. The high frequency shield has through-holes and gas holes. The high frequency shield is provided between the stage and the dielectric plate to extend along the stage. The through-holes are included in a first gas flow path extending from an external first gas supply through the gas discharge holes of the dielectric plate, and communicate the space between the stage and the high frequency shield with the space between the high frequency shield and the dielectric plate. The gas holes are included in a second gas flow path extending from an external second gas supply, and communicate with the space between the stage and the high frequency shield. Since the first gas flow path and the second gas flow path are provided independently in this way, two types of gases that react with each other can be suitably supplied through the use of the first gas flow path and the second gas flow path.

The plasma processing apparatus according to the exemplary embodiment further includes a high frequency shield. The high frequency shield has through-holes. The high frequency shield is provided between the stage and the dielectric plate to extend along the stage. The through-holes are included in a first gas flow path extending from an external first gas supply through the gas discharge holes of the dielectric plate, and communicate the space between the stage and the high frequency shield with the space between the high frequency shield and the dielectric plate. Gas holes are provided in the processing chamber. The gas holes are included in a second gas flow path extending from an external second gas supply, and communicate with the space between the stage and the high frequency shield. The gas holes are arranged along the peripheral edge of the stage above the stage. Since the first gas flow path and the second gas flow path are provided independently in this way, two types of gases that react with each other can be suitably supplied through the use of the first gas flow path and the second gas flow path.

The plasma processing apparatus according to the exemplary embodiment further includes a high frequency shield. The high frequency shield has through-holes. The high frequency shield is provided between the stage and the dielectric plate to extend along the stage. The through-holes are included in a first gas flow path extending from an external first gas supply through the gas discharge holes of the dielectric plate, and communicate the space between the stage and the high frequency shield with the space between the high frequency shield and the dielectric plate. A gas hole is provided in the processing chamber. The gas hole is included in a second gas flow path extending from an external second gas supply, and communicate with the space between the stage and the high frequency shield. The gas hole is arranged above the stage. Since the first gas flow path and the second gas flow path are provided independently in this way, two types of gases that react with each other can be suitably supplied through the use of the first gas flow path and the second gas flow path.

The plasma processing apparatus according to the exemplary embodiment further includes a high frequency shield. The high frequency shield has through-holes. The high frequency shield is provided between the stage and the dielectric plate to extend along the stage. The through-holes are included in a first gas flow path extending from an external first gas supply through the gas discharge holes of the dielectric plate, and communicate the space between the stage and the high frequency shield with the space between the high frequency shield and the dielectric plate.

In the plasma processing apparatus according to the exemplary embodiment, the stage includes a main body formed of an insulator and a conductive layer provided in the main body. The conductive layer has the shortest distance from the upper surface of the stage among one or more conductive layers provided in the stage, and is formed in a ring shape. As described above, among the one or more conductive layers provided in the stage, the conductive layer having the shortest distance from the upper surface of the stage is formed in a ring shape. Accordingly, it is possible to suppress the high frequency bias applied to the substrate placed on the stage.

In the plasma processing apparatus according to the exemplary embodiment, the conductive layer has an outer diameter smaller than the diameter of the substrate placed on the stage.

In the plasma processing apparatus according to the exemplary embodiment, the conductive layer is one of an electrode for generating an electrostatic attraction force between the stage and the substrate mounted on the stage, an electrode to which high frequency waves are supplied, and an electrode to be grounded.

In the plasma processing apparatus according to the exemplary embodiment, the conductive layer is formed in a mesh shape.

The plasma processing apparatus according to the exemplary embodiment further includes a focus ring. The focus ring is made of dielectric material, and is provided on the upper surface of the stage to extend along the peripheral edge of the upper surface of the stage. The inner diameter of the focus ring is smaller than the diameter of the upper surface of the stage.

In the plasma processing apparatus according to the exemplary embodiment, the peripheral edge of the dielectric plate and the peripheral edge of the upper electrode are connected to each other by pressing them through an elastic member. Therefore, even if each part thermally expands due to the heat input from the plasma or the like, it is possible to avoid problems such as cracking of the dielectric plate and the like.

In one exemplary embodiment, a plasma processing method is provided. The plasma processing method is a plasma processing method in which a plasma processing apparatus is used to perform plasma processing on a processing target object. An upper electrode, a dielectric plate, a stage and a waveguide are provided in the processing container of the plasma processing apparatus. The dielectric plate is provided above the stage with a space interposed therebetween in the processing container. The upper electrode is provided above the dielectric plate. The end of the waveguide is arranged to face the space to radiate high frequency waves in a VHF band or a UHF band into the space. In this method, the plasma processing is performed in a state in which a conductive film is provided on the upper surface of the dielectric plate facing the upper electrode and is electrically connected to the upper electrode.

In case of high frequency waves in the VHF band or the UHF band, due to generation of standing waves, uniformity of plasma can be reduced in a direction in which a lower surface of the dielectric plate extends. However, according to exemplary embodiments, the dielectric plate provided below the upper electrode includes a conductive film and the conductive film is provided on the upper surface of the dielectric plate and electrically connected to the upper electrode. Therefore, the dielectric plate, in the high frequency waves, may function as a capacitor connected to the upper electrode. Accordingly, the generation of standing waves can be suppressed, and a gradient of an electric field in vicinity of the upper electrode (more specifically, the dielectric plate) in the space can be reduced. Therefore, it is possible to improve the uniformity of plasma.

Hereinafter, various exemplary embodiments will be described in detail with reference to the drawings. In addition, the same or corresponding parts in each drawing are designated by the same reference numerals. In the present disclosure, the term "contact" means a state in which both objects are not fixed to each other, and the term "connection" means a state in which both objects are fixed or not fixed to each other.

Figure 2:
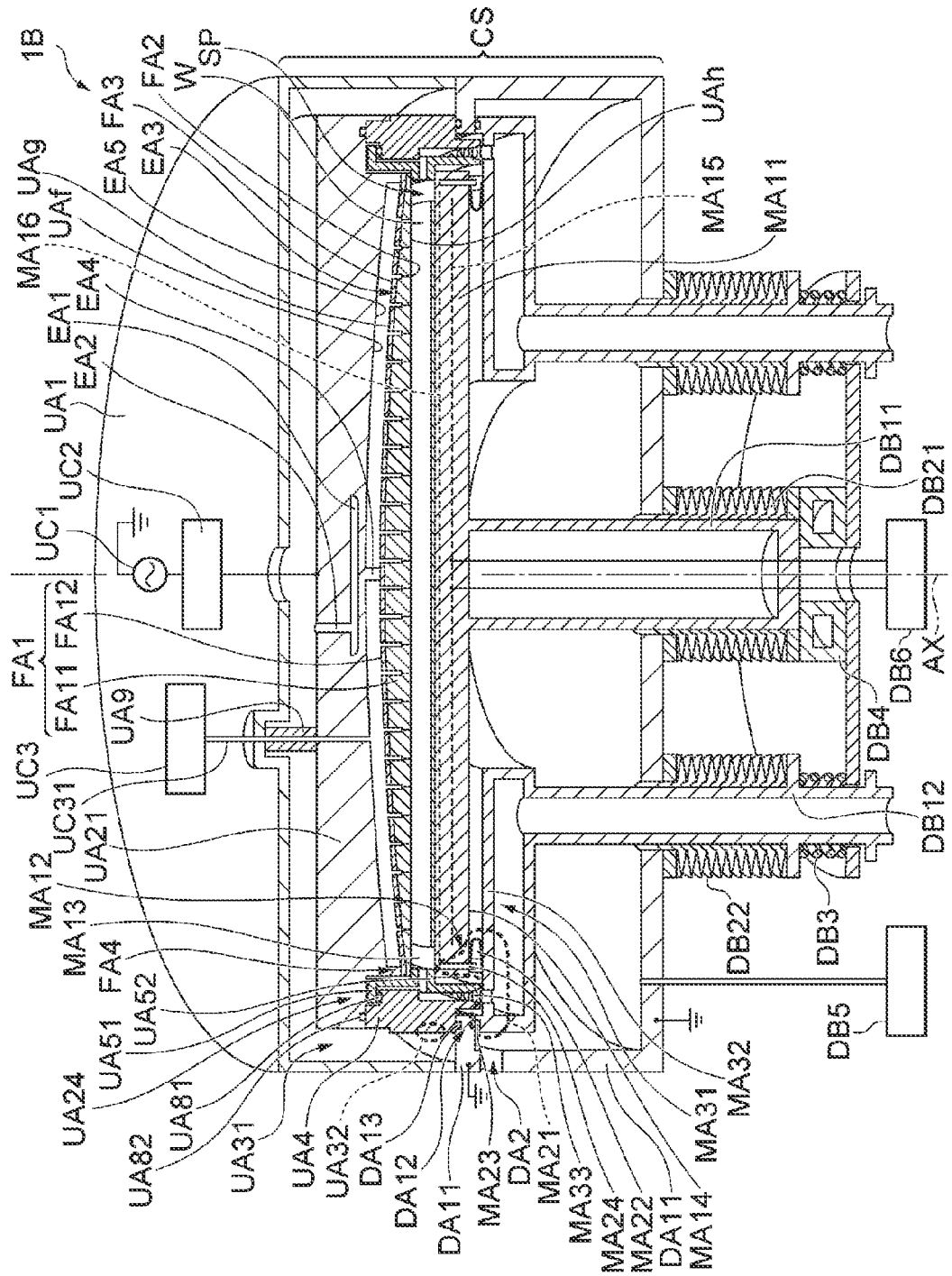
FIG. 2 is a diagram showing another configuration of the plasma processing apparatus according to an exemplary embodiment.
Figure 3:
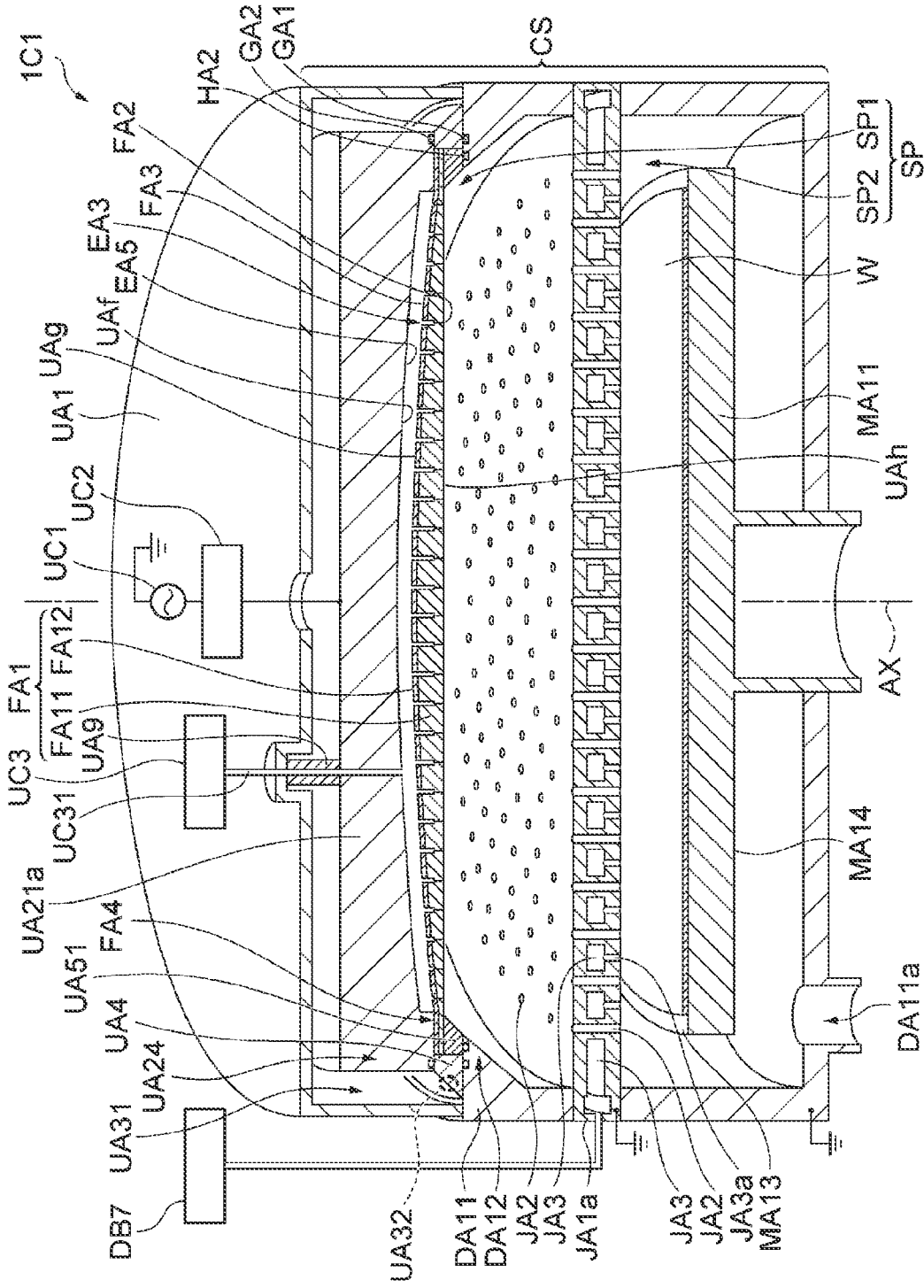
FIG. 3 is a diagram showing yet another configuration of the plasma processing apparatus according to an exemplary embodiment.
Figure 4:
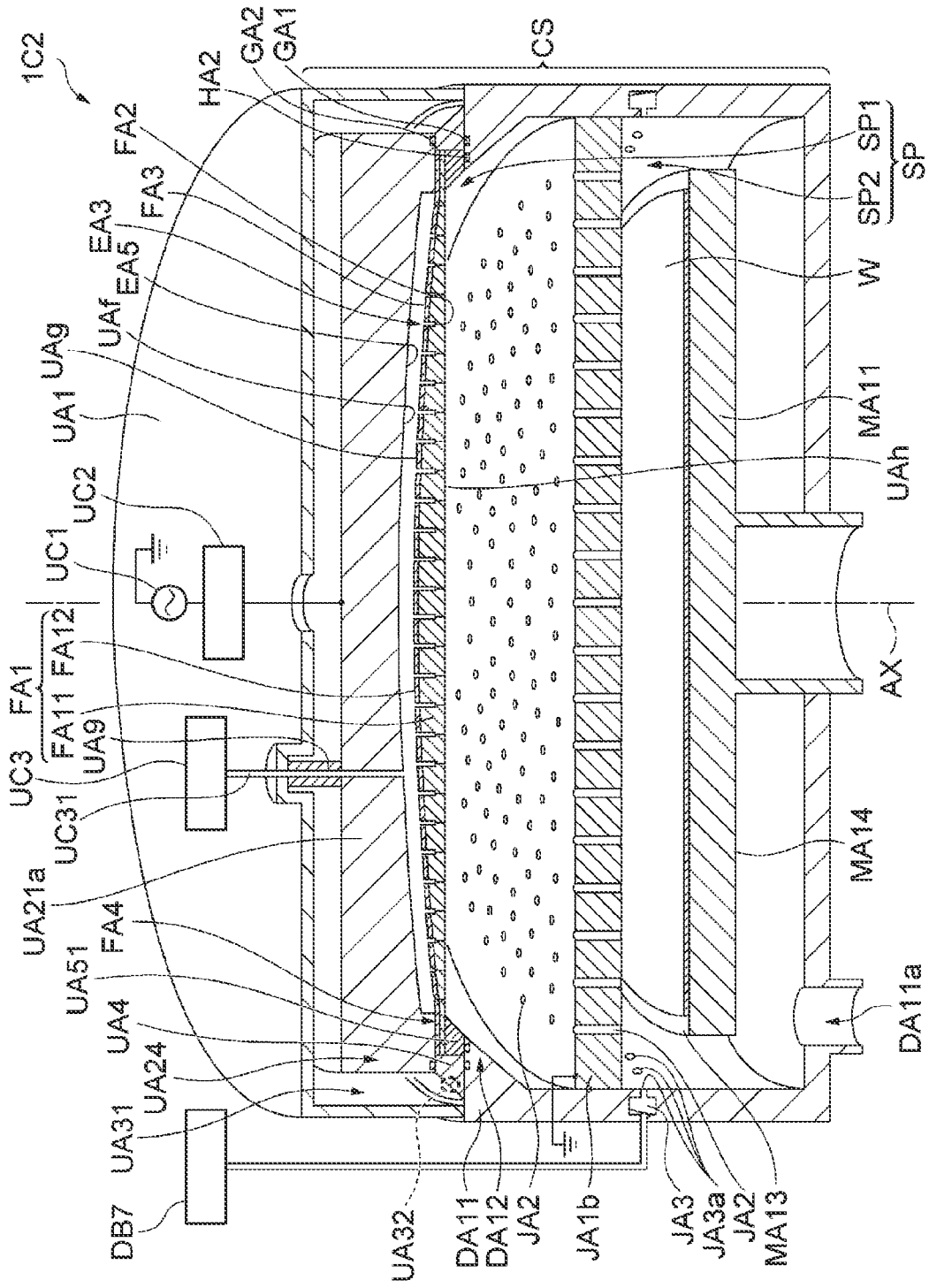
FIG. 4 is a diagram showing a still another configuration of the plasma processing apparatus according to an exemplary embodiment.
Figure 5:
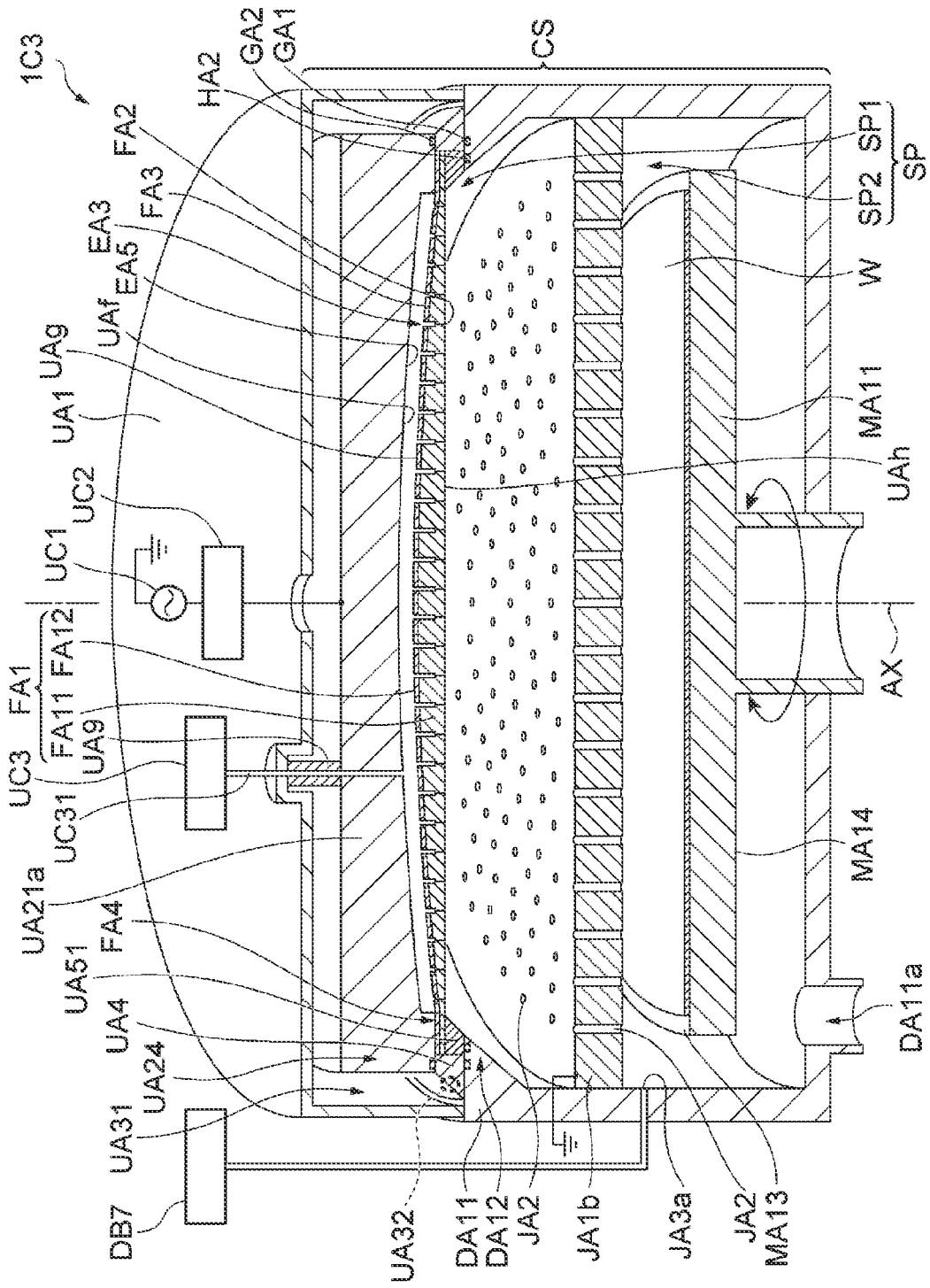
FIG. 5 is a diagram showing a yet still another configuration of the plasma processing apparatus according to an exemplary embodiment.
Figure 6:
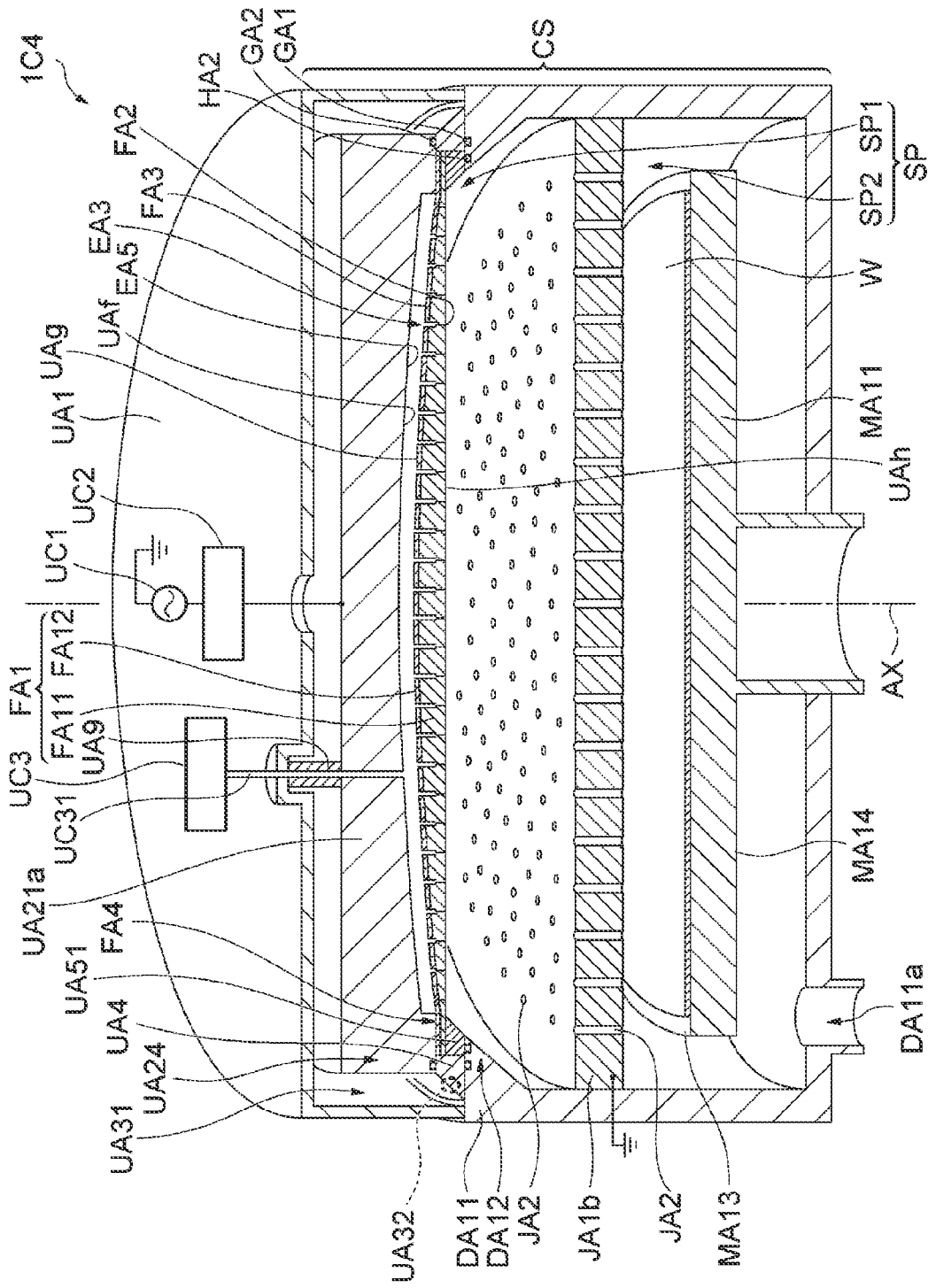
FIG. 6 is a diagram showing an even yet still another configuration of the plasma processing apparatus according to an exemplary embodiment. p

Configurations of the plasma processing apparatuses 1A, 1B, and 1C1 to 1C4 according to a plurality of exemplary embodiments are shown in FIGS. 1 to 5, respectively. FIG. 1 shows a configuration of a plasma processing apparatus 1A, and FIG. 2 shows a configuration of a plasma processing apparatus 1B. FIG. 3 shows a configuration of a plasma processing apparatus 1C1, FIG. 4 shows a configuration of a plasma processing apparatus 1C2, FIG. 5 shows a configuration of a plasma processing apparatus 1C3, and FIG. 6 shows a configuration of a plasma processing apparatus 1C4.

The configuration of the plasma processing apparatus 1A will be described with reference to FIG. 1. The plasma processing apparatus 1A includes a processing container CS. The plasma processing apparatus 1A includes an exhaust port DA11a, a space EA3, a dielectric plate FA1, a sealing member GA2, a sealing member GA1, a conductive elastic member HA1, an elastic member HA2, a stage MA11, and a baffle member MB1. The plasma processing apparatus 1A includes a space SP, an upper electrode UA21, an insulating member UA4, a support ring UA51, a pipe UA9, and a gas pipe UC31.

The processing container CS has a substantially cylindrical shape. The processing container CS extends substantially in a vertical direction. A central axis of the processing container CS is an axis AX extending in the substantially vertical direction. The processing container CS includes a waveguide wall UA1, a side wall DA11, and a waveguide UA31. The space SP in the processing container CS is a space between the dielectric plate FA1 and the stage MA11 (which may also be referred to as a substrate W (processing target object) mounted on the stage MA11).

The side wall DA11 includes a projection DA12. The side wall DA11 is grounded. A material of the side wall DA11 may be a conductive material such as aluminum, aluminum alloy, or the like.

The upper electrode UA21 includes a cavity EA1, a hole EA2, a peripheral edge UA24, a protrusion EA4, and a lower surface UAf. The lower surface UAf includes a region EA5. The waveguide UA31 includes an end UA32.

The dielectric plate FA1 includes a main body FA11, a conductive film FA12, a gas discharge hole FA2, a peripheral edge FA4, and an upper surface UAg. The upper surface UAg includes a region FA3.

The stage MA11 includes a main body MA11a, a conductive layer MA15, an upper surface MA13, and a back surface MA14. The conductive layer MA15 includes a heater member MA15a and a heater member MA15b.

The dielectric plate FA1 has a substantially disk-like shape. The lower surface UAh of the dielectric plate FA1 extends substantially horizontally along the upper surface MA13 of the stage MA11 (hereinafter, the same applies in the present disclosure). The lower surface UAh of the dielectric plate FA1 is a surface existing on the opposite side of the upper surface UAg of the dielectric plate FA1 and exposed in the space SP.

A material of the upper electrode UA21 is a conductive material such as aluminum alloy or the like. A corrosion-resistant film is formed on the surface of the upper electrode UA21. The corrosion-resistant film may be an aluminum oxide film, an yttrium oxide film, or a ceramic film containing aluminum oxide, yttrium oxide or the like.

The region EA5 is provided on the lower surface UAf inward of the peripheral edge UA24. A vertical position of the region EA5 becomes lower as the distance from the axis AX increases (distance from the stage MA11 becomes shorter). The region EA5 is, for example, a curved surface and may be a concave surface.

The protrusion EA4 is provided between the upper electrode UA21 and the dielectric plate FA1. The protrusion EA4 protrudes downward (toward the dielectric plate FA1 and the stage MA11) along the axis AX from a center of the region EA5 of the lower surface UAf of the upper electrode UA21.

In one embodiment, a material of the protrusion EA4 is the same as a material of the upper electrode UA21, and is a conductive material having good thermal conductivity. The protrusion EA4 has, for example, a rod shape. The protrusion EA4 may be formed integrally with the upper electrode UA21.

The cavity EA1 is provided above the protrusion EA4 and in the upper electrode UA21. Therefore, a portion of the upper electrode UA21 between the region EA5 and the cavity EA1 is relatively thin and easily bent. The hole EA2 connects the cavity EA1 and the waveguide UA31 (i.e., the atmospheric pressure space).

A central axis of the main body FA11 of the dielectric plate FA1 substantially coincides with the axis AX. A material of the main body FA11 is a dielectric material such as aluminum nitride, aluminum oxide or the like. The main body FAH has a substantially disk-like shape.

The conductive film FA12 is formed on the upper surface UAg of the dielectric plate FA1. The conductive film FA12 is electrically connected to the upper electrode UA21 in the peripheral edge FA4 of the dielectric plate FA1 and the peripheral edge UA24 of the upper electrode UA21. Therefore, the conductive film FA12 has the same electric potential as the upper electrode UA21 (the same applies to the plasma processing apparatus 1B described later).

A material of the conductive film FA12 is a material having conductivity. A material of the conductive film FA12 is, for example, aluminum, nickel, stainless steel, tungsten, molybdenum, copper, or gold. The conductive film FA12 is, for example, a metal sprayed film.

The peripheral edge FA4 of the dielectric plate FA1 is provided between the peripheral edge UA24 of the upper electrode UA21 and an upper end (projection DA12) of the side wall DA11. A conductive elastic member HA1 having elasticity is provided between the peripheral edge FA4 of the dielectric plate FA1 and the peripheral edge UA24 of the upper electrode UA21. The conductive elastic member HA1 has elasticity and is, for example, a spiral ring. The conductive elastic member HA1 stably maintains an electrical connection between the upper electrode UA21 and the conductive film FA12. A material of the conductive elastic member HA1 is, for example, metal such as stainless steel, Inconel, nickel, tungsten, tantalum, copper alloy, molybdenum or the like, and may be coated with a protective film made of nickel, aluminum, stainless steel, gold or the like. A corrosion-resistant film may be formed on a surface (particularly the lower surface UAh) of the dielectric plate FA1. The corrosion-resistant film may be an yttrium oxide film, an yttrium oxide fluoride film, an yttrium fluoride film, or a ceramic film containing yttrium oxide, yttrium fluoride or the like.

The peripheral edge FA4 of the dielectric plate FA1 is sandwiched between the peripheral edge UA24 of the upper electrode UA21 and the upper end (projection DA12) of the side wall DA11 via the conductive elastic member HA1 and the elastic member HA2. The elastic member HA2 has elasticity. The elastic member HA2 is, for example, an O-ring.

A support ring UA51 may be provided between the peripheral edge FA4 of the dielectric plate FA1 and the upper end (projection DA12) of the side wall DA11. A material of the support ring UA51 may be a dielectric material such as aluminum nitride, aluminum oxide or the like. The elastic member HA2 may be interposed between the support ring UA51 and the upper end (projection DA12) of the side wall DA11.

The insulating member UA4 extends in a circumferential direction on an outer side of the peripheral edge FA4 of the dielectric plate FA1 and the support ring UA51. The insulating member UA4 is sandwiched between the peripheral edge UA24 of the upper electrode UA21 and the upper end (projection DA12) of the side wall DA11 via the sealing member GA1 and the sealing member GA2.

The insulating member UA4 is a ring-shaped member. A material of the insulating member UA4 may be a dielectric material such as aluminum nitride, aluminum oxide or the like.

The dielectric plate FA1 has a thickness distribution (has a non-uniform thickness) in the radial direction of the dielectric plate FA1 (direction intersecting the axis AX and the direction in which the dielectric plate FA1 extends). In one embodiment, the thickness of the dielectric plate FA1 excluding the peripheral edge FA4 is a cosine function or a Gaussian function of the distance from the axis AX. The thickness of the peripheral edge FA4 of the dielectric plate FA1 may be substantially constant. However, the present disclosure is not limited thereto. For example, the thickness of the dielectric plate FA1 may increase or decrease from the peripheral FA4 of the dielectric plate FA1 toward the center (portion intersecting the axis AX). Since the dielectric plate FA1 has a thickness distribution as described above, the high frequency current flowing from the plasma generated under the dielectric plate FA1 is reduced, and the excitation of the plasma is suppressed. By optimizing the thickness distribution of the dielectric plate FA1 as in the present embodiment, it is possible to generate uniform plasma above the substrate W.

The lower surface UAh of the dielectric plate FA1 faces the stage MA11 and is substantially flat. The lower surface UAh of the dielectric plate FA1 is exposed to the space SP and faces plasma when the plasma is generated. The upper surface UAg of the dielectric plate FA1 includes a region FA3 extending inward of the peripheral edge FA4 of the dielectric plate FA1.

The vertical position of the region FA3 becomes lower as the distance from the axis AX increases (distance from the stage MA11 becomes shorter). In one embodiment, the region FA3 is, for example, a curved surface and may be a convex surface.

Since the dielectric plate FA1 has such a thickness distribution, the plasma processing apparatus 1A can reduce the radial non-uniformity of the intensity of the electric field formed by the high frequency.

In one embodiment, the dielectric plate FA1 may be a shower plate. Gas discharge holes FA2 are formed in the dielectric plate FA1. The gas discharge holes FA2 are holes for discharging a gas from the gas supply UC3 into the space SP.

Figure 7:
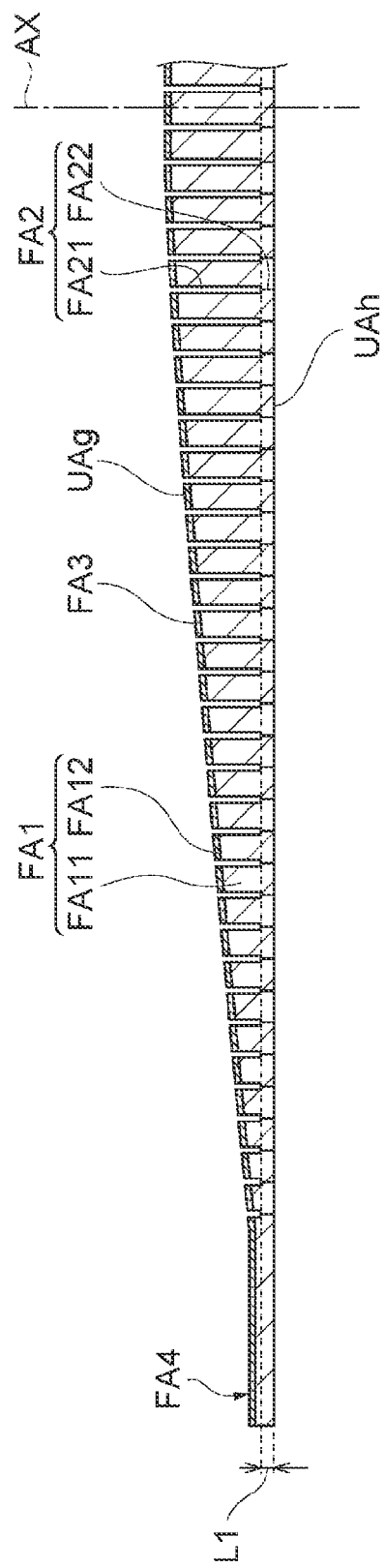
FIG. 7 is a diagram showing in more detail an example of a configuration of a dielectric plate shown in each of FIGS. 1 to 6.

As shown in FIG. 7, each of the gas discharge holes FA2 penetrates the dielectric plate FA1 from the upper surface UAg to the lower surface UAh of the dielectric plate FA1. Each of the gas discharge holes FA2 includes upper holes FA21 and lower holes FA22 that communicate with each other. The upper holes FA21 are provided in the upper surface UAg of the dielectric plate FA1. The lower holes FA22 are provided on the lower surface UAh of the dielectric plate FA1.

In the gas discharge holes FA2, the upper holes FA21 are large-diameter portions, and the lower holes FA22 are small-diameter portions. The diameter of the upper holes FA21 is larger than the diameter of the lower holes FA22.

In each of the gas discharge holes FA2, the small-diameter lower holes FA22 extend under the large-diameter upper holes FA21 and communicate with the large-diameter upper holes FA21. The upper holes FA21 communicate with the space EA3. The lower holes FA22 communicate with the space SP.

The gas discharge holes FA2 have the large-diameter upper holes FA21 whose length is adjusted to increase according to a size of a thickness of the dielectric plate FA1 at a portion where they are formed. In the gas discharge holes FA2, the lengths L1 of the lower holes FA22 are aligned with each other and are substantially the same as each other.

The region FA3 of the upper surface UAg of the dielectric plate FA1 faces the region EA5 of the lower surface UAf of the upper electrode UA21. The region FA3 and the region EA5 are separated from each other. A space EA3 is provided between the region FA3 and the region EA5.

A gas pipe UC31 is connected to the space EA3. A gas supply UC3 is connected to the gas pipe UC31. The gas supply UC3 includes one or more gas sources used for processing the substrate W. The gas supply UC3 includes one or more flow rate controllers for controlling flow rates of gases supplied from one or more gas sources.

A gas from the gas supply UC3 is supplied to the space EA3 via the gas pipe UC31. The gas supplied to the space EA3 is discharged to the space SP through the gas discharge holes FA2.

A lower end of the protrusion EA4 of the upper electrode UA21 comes into contact with the dielectric plate FA1 (particularly the conductive film FA12 in one embodiment). A pressure in the space EA3 is lower than atmospheric pressure. Therefore, the protrusion EA4 of the upper electrode UA21 is pressed against the conductive film FA12. Accordingly, the protrusion EA4 is in close contact with the dielectric plate FA1 (particularly the conductive film FA12 in one embodiment). Thus, the protrusion EA4 is thermally connected to the dielectric plate FA1. Therefore, a heat dissipation path from the dielectric plate FA1 to the upper electrode UA21 is stably secured.

The waveguide wall UA1 includes a ceiling and a side of the waveguide wall UA1. The upper electrode UA21 is accommodated in the waveguide wall UA1. A material of the waveguide wall UA1 may be a conductive material such as aluminum, aluminum alloy or the like. The waveguide wall UA1 is grounded.

A ceiling of the waveguide wall UA1 has a substantially disk-like shape, and extends substantially horizontally along the upper surface of the upper electrode UA21 above the upper electrode UA21. A central axis of the ceiling of the waveguide wall UA1 substantially coincides with the axis AX. The ceiling of the waveguide wall UA1 is spaced apart from the upper surface of the upper electrode UA21.

A side of the waveguide wall UA1 has a substantially cylindrical shape. The side of the waveguide wall UA1 extends downward from a peripheral edge of the ceiling of the waveguide wall UA1.

The side of the waveguide wall UA1 is provided on a radial outer side of the upper electrode UA21 so as to surround the upper electrode UA21. The side of the waveguide wall UA1 is spaced apart from the upper electrode UA21. A lower end of the side of the waveguide wall UA1 is connected to the upper end (projection DA12) of the side wall DA11. The waveguide wall UA1 is grounded.

The waveguide UA31 is a space extending from between the ceiling of the waveguide wall UA1 and the upper surface of the upper electrode UA21 to between the side of the waveguide wall UA1 and an outer peripheral surface of the upper electrode UA21. The waveguide UA31 has an end UA32. The end UA32 is connected to the insulating member UA4.

In the plasma processing apparatus 1A, a high frequency power source UC1 is electrically connected to the upper electrode UA21 via a matcher UC2. In the present disclosure, the high frequency may be high frequency waves in a VHF band or a UHF band.

The high frequency from the high frequency power source UC1 is supplied to the insulating member UA4 via the end UA32 of the waveguide UA31. The high frequency is further supplied to the space SP via the insulating member UA4. When the high frequency is supplied to the space SP, a gas in the space SP is excited to generate plasma from the gas. The substrate W is processed by a chemical species from the plasma.

In the plasma processing apparatus 1A, the gas pipe UC31 extends to the space EA3 through the waveguide UA31. The upper electrode UA21 that defines the waveguide UA31 is not grounded.

In order to prevent a gas from being excited in the gas pipe UC31, the gas pipe UC31 is surrounded by a pipe UA9 in the waveguide UA31. A material of the pipe UA9 may be an insulating material such as aluminum nitride, aluminum oxide or the like. Further, in order to increase a length of the pipe UA9, the ceiling of the waveguide wall UA1 is formed so as to protrude upward around the pipe UA9.

A vertical distance between the lower surface UAh of the dielectric plate FA1 and the upper surface MA13 of the stage MA11 (width of the space SP) may be, for example, 5 cm or more and 30 cm or less.

The stage MA11 includes a main body MA11a and a conductive layer MA15. The stage MA11 is provided in the processing container CS. The stage MA11 is configured to substantially horizontally support the substrate W mounted on the upper surface MA13 of the stage MA11.

The stage MA11 has a substantially disk-like shape. A central axis of stage MA11 substantially coincides with the axis AX.

The conductive layer MA15 has a function as a heater (resistive heating element) for heating the substrate W mounted on the upper surface MA13 via the upper surface MA13 of the stage MA11. The conductive layer MA15 includes a heater member MA15a and a heater member MA15b. A material of the conductive layer MA15 may be metal such as tungsten, molybdenum or the like.

The heater member MA15a and the heater member MA15b are embedded inside the main body MA11a. The heater member MA15*a* and the heater member MA15*b* are not in contact with each other. A material of the main body MA11*a* is an insulator such as aluminum nitride, aluminum oxide or the like.

The heating region of the stage MA11 is divided into two zones in the radial direction. The heating of each zone is performed by the conductive layer MA15.

The heater member MA15*a* heats a zone at a center of the main body MA11*a*. The heater member MA15*b* heats a zone existing in the outer periphery of the main body MA11*a*.

A common mode filter DB61*a* is electrically connected to the heater member MA15*a*. A heater power source DB62*a* is electrically connected to the common mode filter DB61*a*.

A common mode filter DB61*b* is electrically connected to the heater member MA15*b*. A heater power source DB62*b* is electrically connected to the common mode filter DB61*b*.

The common mode filter DB61*a* is provided between the heater member MA15*a* and the heater power source DB62*a*, and the common mode filter DB61*b* is provided between the heater member MA15*b* and the heater power source DB62*b*.

Each of the common mode filter DB61*a* and the common mode filter DB61*b* has a relatively high common mode impedance at a plasma excitation frequency. Therefore, an electrical coupling between the heater member MA15*a* and the heater member MA15*b* may be weakened. As a result, an electrical coupling between the plasma and the heater member MA15*a* and the heater member MA15*b* can be suppressed at the outer periphery and the center of the main body MA11*a* of the stage MA11, and the high frequency electric field applied between the center and the end of the substrate W can be suppressed.

The baffle member MB1 extends between the stage MA11 and the side wall DA11. The baffle member MB1 is a ring-shaped plate member. A material of the baffle member 13 may be, for example, an insulator such as aluminum nitride, aluminum oxide or the like.

Through-holes are formed in the baffle member MB1. The through-holes penetrate the baffle member MB1 in the plate thickness direction.

A region under the back surface MA14 of the stage MA11 communicates with the exhaust port DA11*a*. The exhaust port DA11*a* is connected to an external exhaust device. The exhaust system may include a pressure control valve, a turbo molecular pump and/or a vacuum pump such as a dry pump or the like.

In the plasma processing apparatus 1A, an area of the inner wall surface of the side wall DA11 extending above the baffle member MB1 is substantially equal to the surface area of the dielectric plate FA1 on the side of the space SP. That is, an area of a surface (ground surface) set to a ground potential among surfaces defining the space SP is substantially equal to an area of a surface provided by the dielectric plate FA1 among the surfaces defining the space SP.

The configuration of the plasma processing apparatus 1B will be described with reference to FIG. 2. A vertical distance between the dielectric plate FA1 and the upper surface MA13 of the stage MA11 (width of the space SP) in the plasma processing apparatus 1B is shorter than that in the case of the plasma processing apparatus 1A, and may be, for example, 5 mm or more and 15 mm or less.

The plasma processing apparatus 1B includes a processing container CS. The plasma processing apparatus 1B includes a sealing member DA13, an inlet/outlet port DA2, a spring DB3, a support DB11, an exhaust pipe DB12, a bellows DB21, a bellows DB22, a water-cooled plate DB4, and a heater power source DB6.

The plasma processing apparatus 1B includes a conductor MA21, a conductive plate MA22, a conductive elastic member MA23, a pin MA24, an exhaust chamber MA31, and a wall MA32. The plasma processing apparatus 1B includes a space SP, an upper electrode UA21, an insulating member UA4, a support ring UA51, a covering UA52, an elastic member UA81, a sealing member UA82, a pipe UA9, and a gas pipe UC31.

The plasma processing apparatus 1B includes a space EA3, a dielectric plate FA1, and a stage MA11. The stage MA11 includes a conductive layer MA15 and a conductive layer MA16.

Hereinafter, the plasma processing apparatus 1B will be mainly described on configurations that are different from those of the plasma processing apparatus 1A.

The projection DA12 of the side wall DA11 is provided at the end of the side wall DA11 (portion connected to the side of the waveguide wall UA1) to extend in the direction intersecting the axis AX toward the axis AX. The projection DA12 is connected to the insulating member UA4 via the sealing member DA13.

The sealing member DA13 is a member for vacuum sealing, and may be, for example, an O-ring. The projection DA12 is connected to the wall MA32 of the exhaust chamber MA31 via the conductive elastic member MA23. The conductive elastic member MA23 is an elastic body and may be, for example, a spiral ring. A material of the conductive elastic member MA23 is, for example, metal such as stainless steel, Inconel, nickel, tungsten, tantalum, copper alloy, molybdenum or the like. The conductive elastic member MA23 may be coated with a protective film made of nickel, aluminum, stainless steel, gold or the like.

The insulating member UA4 is arranged between the end UA32 and the space SP. The insulating member UA4 and the upper electrode UA21 are connected via a sealing member UA82. The sealing member UA82 is a member for vacuum sealing, and may be, for example, an O-ring.

The upper electrode UA21 is arranged below the ceiling of the waveguide wall UA1, and is provided above the upper surface MA13 of the stage MA11 via the space SP in the processing container CS and the dielectric plate FA1.

The peripheral edge FA4 of the dielectric plate FA1 and the peripheral edge UA24 of the upper electrode UA21 are connected to each other by a pressure through the elastic member UA81 or the like. Accordingly, even if each part thermally expands due to an input heat from the plasma or the like, it is possible to avoid problems such as cracking of the dielectric plate FA1 and the like.

The peripheral edge FA4 of the dielectric plate FA1 is brought into close contact with the peripheral edge UA24 of the upper electrode UA21 by a support ring UA51. The support ring UA51 is a member that brings the peripheral edge FA4 of the dielectric plate FA1 into close contact with the peripheral edge UA24 of the upper electrode UA21. The support ring UA51 is held by the insulating member UA4 via the elastic member UA81. The elastic member UA81 can be, for example, an O-ring.

The covering UA52 is a member that prevents plasma from being generated near the side surface of the stage MA11. A material of the covering UA52 may be a dielectric material such as aluminum nitride, aluminum oxide or the like.

The stage MA11 of the plasma processing apparatus 1B includes a conductive layer MA15 and a conductive layer MA16. In the plasma processing apparatus 1B, a material of the stage MA11 may be a dielectric material such as aluminum nitride, aluminum oxide or the like. The conductive layer MA15 and the conductive layer MA16 are embedded in the stage MA11.

The conductive layer MA15 is provided on the back surface MA14 of the stage MA11, the conductive layer MA16 is provided on the conductive layer MA15, and the upper surface MA13 is provided on the conductive layer MA16.

The conductive layer MA15 and the conductive layer MA16 extend along the upper surface MA13 of the stage MA11. The substrate W may come into contact with the upper surface MA13. The conductive layer MA15 and the conductive layer MA16 may have, for example, a mesh-like shape. In the plasma processing apparatus 1B, a material of the conductive layer MA15 and the conductive layer MA16 may be a conductive material such as tungsten, molybdenum or the like. The conductive layer MA15 supplies heat to the stage MA11 by an electric power supplied from a heater power source DB6.

The conductor MA21 extends between the peripheral edge MA12 of the stage MA11 and the side wall DA11 of the processing container CS. The conductor MA21 is electrically connected to the conductive layer MA16 and the side wall DA11 of the processing container CS.

The conductor MA21 extends from the peripheral edge MA12 toward the side wall DA11 so that the high frequency radiated from the end UA32 of the waveguide UA31 is introduced into the space SP. The conductor MA21 includes a conductive plate MA22 and a pin MA24. The conductor MA21 includes a part of the wall MA32.

The conductive plate MA22 is in contact with the back surface MA14 at the peripheral edge MA12. The conductive plate MA22 is a flexible thin plate. A material of the conductive plate MA22 is, for example, a conductive material such as aluminum, aluminum alloy, stainless steel, Inconel, nickel, tungsten, tantalum, copper alloy, molybdenum or the like. The conductive plate MA22 may be coated with a protective film made of aluminum oxide, yttrium oxide, yttrium oxide fluoride, yttrium fluoride, nickel, aluminum, stainless steel, gold or the like. The conductive plate MA22 is fixed to the pin MA24 and the upper surface of the wall MA32 by a screw (not shown).

The pin MA24 is embedded in the peripheral edge MA12. A material of the pin MA24 is a conductive material such as nickel, tungsten, molybdenum or the like, and may be coated with a protective film made of aluminum oxide, yttrium oxide, yttrium oxide fluoride, yttrium fluoride or the like. One end of the pin MA24 is electrically connected to the conductive layer MA16, and the other end of the pin MA24 penetrates the back surface MA14 of the stage MA11 and is electrically connected to the conductive plate MA22.

The exhaust chamber MA31 includes a conductive wall MA32. The exhaust chamber MA31 extends from the periphery of the peripheral edge MA12 toward the side wall DA11. The exhaust chamber MA31 communicates with the space SP. The exhaust chamber MA31 communicates with the exhaust pipe DB12.

The exhaust pipe DB12 is connected to an external exhaust device. The exhaust system may include a pressure control valve, a turbo molecular pump and/or a vacuum pump such as a dry pump or the like.

A material of the wall MA32 may be a conductive material such as aluminum, aluminum alloy or the like. The wall MA32 includes a vent MA33. The space SP communicates with the exhaust chamber MA31 via the vent hole MA33.

A gas in the space SP may move to the exhaust chamber MA31 through the vent MA33 and may be exhausted to the outside through the exhaust pipe DB12.

The side wall DA11 includes an inlet/outlet port DA2. The substrate W is loaded into the processing container CS and unloaded from the processing container CS via the inlet/outlet port DA2. The space defined by the side wall DA11 and communicating with the outside via the inlet/outlet port DA2 also communicates with the gas supply DB5.

The gas supply DB5 may supply a purge gas such as an Ar gas or the like into the space defined by the side wall DA11 and communicating with the outside via the inlet/outlet port DA2.

The support DB11 is connected to the stage MA11. The stage MA11 is provided on the support DB11. By moving the support DB11 up and down (moving the support DB11 toward the upper electrode UA21 or away from the upper electrode UA21) (the same applies hereinafter), the stage MA11 is moved up and down.

The water-cooled plate DB4 is arranged below the DB11. The support DB11 is in contact with the water-cooled plate DB4. The heat of the stage MA11 may be discharged to the outside via the support DB11 and the water-cooled plate DB4.

The exhaust pipe DB12 is connected to the wall MA32 and communicates with the exhaust chamber MA31. The wall MA32 is provided on the exhaust pipe DB12. A gas in the exhaust chamber MA31 may be discharged to the outside through the exhaust pipe DB12.

By moving the exhaust pipe DB12 up and down via the spring DB3, the exhaust chamber MA31 and the wall MA32 is moved up and down.

A material of the bellows DB22 may be a conductive material such as stainless steel or the like. A material of the spring DB3 may be a conductive material such as stainless steel or the like.

The wall MA32 may be stably arranged on the side of the upper electrode UA21 (upper portion) by elasticity of the spring DB3. As a result, the outer periphery of the wall MA32 comes into close contact with the back surface of the protrusion DA12. Further, by the elasticity of the conductive elastic member MA23, the outer periphery of the wall MA32 and the protrusion DA12 may be stably electrically contacted to each other.

As described above, in the plasma processing apparatus 1B, high frequency waves are supplied from the high frequency power source UC1 to the upper electrode UA21. The high frequency is introduced into the space SP from the end UA32 of the waveguide UA31 toward the axis AX via the insulating member UA4.

The conductor MA21 (particularly a part of the wall MA32) extends from the peripheral edge MA12 toward the side wall DA11 so that the high frequency radiated from the end UA32 of the waveguide UA31 is introduced into the space SP.

By the conductor MA21 (particularly the part of the wall MA32), the space provided between the end UA32 of the waveguide UA31 and the space SP and configured to propagate the high frequency radiated from the end UA32 may be roughly divided into upper and lower sides of the surface that connects the end UA32 and the space SP.

The conductor MA21 is electrically connected to the side wall DA11 which is grounded, and may have an electrical shielding function.

Accordingly, the high frequency radiated from the end UA32 of the waveguide UA31 may be sufficiently introduced into the space SP by the conductor MA21 without being dispersed to the region extending below the stage MA11. Therefore, high frequency waves having enough intensity can be supplied to the space SP.

When the high frequency is introduced into the space SP, the gas is excited in the space SP and plasma is generated from the gas. The plasma is generated in the space SP with a uniform density distribution in the circumferential direction. The substrate W on stage MA11 is processed with a chemical species from the plasma.

Further, since the conductor MA21 is in electrical contact with the pin MA24 via the flexible conductive plate MA22, even when the position of the conductor MA21 is changed, the electrical contact between the conductor MA21 and the pin MA24 can be reliably maintained.

The configurations of the plasma processing apparatuses 1C1 to 1C4 will be described with reference to FIGS. 3 to 6. Each of the plasma processing apparatuses 1C1 to 1C4 includes an upper electrode UA21a in place of the upper electrode UA21 of the plasma processing apparatus 1A and the plasma processing apparatus 1B. The upper electrode UA21a does not include the cavity EA1, the hole EA2 and the protrusion EA4 which are included in the upper electrode UA21. The conductive film FA12 is electrically connected to the upper electrode UA21a at the peripheral edge FA4 of the dielectric plate FA1 and the peripheral edge UA24 of the upper electrode UA21a, and therefore has the same electric potential as the upper electrode UA21a.

Each of the plasma processing apparatuses 1C1 to 1C4 does not include the baffle member MB1 of the plasma processing apparatus 1A and the plasma processing apparatus 1B. The plasma processing apparatus 1C1 includes a high frequency shield JA1a. The plasma processing apparatus 1C2, the plasma processing apparatus 1C3 and the plasma processing apparatus 1C4 include a high frequency shield JA1b. A material of each stage MA11 of the plasma processing apparatuses 1C1 to 1C4 may be a conductive material such as aluminum, aluminum alloy or the like. A protective film made of yttrium oxide, yttrium oxide fluoride, aluminum oxide or the like may be provided on the surface of the stage MA11.

The plasma processing apparatuses 1C1 to 1C3 include a gas supply DB7. The gas from the gas supply DB7 may be a reduction gas such as a $H_2$ gas or the like, and the gas from the gas supply UC3 may be a processing gas such as a $CH_4$ gas or the like.

The configuration of the plasma processing apparatus 1C1 will be described with reference to FIG. 3. The high frequency shield JA1a has a substantially disk-like shape, and includes through-holes JA2, a void JA3, and gas discharge holes JA3a.

The high frequency shield JA1a is provided between the dielectric plate FA1 and the stage MA11, and is arranged in parallel with the dielectric plate FA1 and the stage MA11. The high frequency shield JA1a extends along the stage MA11.

A material of the high frequency shield JA1a is a conductive material such as aluminum, aluminum alloy or the like. The high frequency shield JA1a is grounded.

The through-holes JA2 penetrate the high frequency shield JA1a in a thickness direction of the high frequency shield JA1a. The space SP includes an upper space SP1 and a lower space SP2. The through-holes JA2 communicate with the upper space SP1 between the dielectric plate FA1 and the high frequency shield JA1a and the lower space SP2 between the high frequency shield JA1a and the stage MA11. The through-holes JA2 are provided so as to be substantially evenly distributed in the stage MA11.

The through-holes JA2 are included in a first gas flow path extending from the external gas supply UC3 (first gas supply) via the gas discharge holes FA2 of the dielectric plate FA1. The through-holes JA2 supply a gas supplied from the gas supply UC3 to the lower space SP2 between the stage MA11 and the high frequency shield JA1a.

The void JA3 is provided inside the high frequency shield JA1a. The void JA3 extends from the center to the peripheral edge of the high frequency shield JA1a inside the high frequency shield JA1a, and the void JA3 is connected to the gas supply DB7 (second gas supply).

The void JA3 is connected to gas discharge holes JA3a. The gas discharge holes JA3a communicates the lower space SP2 between the stage MA11 and the high frequency shield JA1a with the void JA3.

The gas discharge holes JA3a are provided so as to be substantially evenly distributed in the stage MA11. The gas discharge holes JA3a are included in the second gas flow path extending from the external gas supply DB7.

A gas from the gas supply UC3 is supplied to the upper space SP1 between the dielectric plate FA1 and the high frequency shield JA1a to generate plasma and radicals. As the gas from the gas supply UC3, the plasma and the gas containing part of the radicals may be supplied substantially evenly from the through-holes JA2 onto the substrate W mounted on the stage MA11. A gas from the gas supply DB7 is supplied substantially evenly from the gas discharge holes JA3a onto the substrate W mounted on the stage MA11. Further, in case a diameter of the through-holes JA2 is small and a length thereof is large, almost all charged particles disappear on an inner surface of the through-holes JA2. Therefore, the plasma is not supplied from the through-holes JA2 to the lower space SP2.

The void JA3 and the gas discharge holes JA3a do not communicate with the through-holes JA2. The first gas flow path from the gas supply UC3 and the second gas flow path from the gas supply DB7 are provided independently of each other. Since the first gas flow path and the second gas flow path are provided independently in this way, two types of gases that react with each other can be suitably supplied through the use of the first gas flow path and the second gas flow path.

The configuration of the plasma processing apparatus 1C2 will be described with reference to FIG. 4. The high frequency shield JA1b has a substantially disk-like shape and includes through-holes JA2. A peripheral edge of the high frequency shield JA1b is connected to the side wall DA11.

The high frequency shield JA1b is provided between the dielectric plate FA1 and the stage MA11, and is arranged in parallel with the dielectric plate FA1 and the stage MA11. The high frequency shield JA1b extends along the stage MA11.

A material of the high frequency shield JA1b is a conductive material such as aluminum, aluminum alloy or the like. The high frequency shield JA1b is grounded.

The through-holes JA2 penetrate the high frequency shield JA1b in the thickness direction of the high frequency shield JA1b. The space SP includes an upper space SP1 and a lower space SP2. The through-holes JA2 communicate with the upper space SP1 between the dielectric plate FA1 and the high frequency shield JA1b and the lower space SP2 between the high frequency shield JA1b and the stage MA11.

In the plasma processing apparatus 1C2, the void JA3 is provided in the side wall DA11 of the processing container CS. The void JA3 has a ring shape extending substantially horizontally (in the direction intersecting the axis AX), and surrounds the lower space SP2 between the high frequency shield JA1b and the stage MA11. The void JA3 is connected to the gas supply DB7 (second gas supply).

In the plasma processing apparatus 1C2, gas discharge holes JA3a are provided on the side wall DA11 of the processing container CS. The gas discharge holes JA3a communicate with the space between the stage MA11 and the high frequency shield JA1b. The gas discharge holes JA3a communicate with the void JA3.

The gas discharge holes JA3a are provided on the inner surface of the side wall DA11. The gas discharge holes JA3a are arranged substantially evenly along the peripheral edge of the stage MA11 above the stage MA11. The gas from the gas supply DB7 is supplied from the gas discharge holes JA3a to the space between the high frequency shield JA1b and the stage MA11.

The gas from the gas supply UC3 (first gas supply) is supplied to the upper space SP1 between the dielectric plate FA1 and the high frequency shield JA1b to generate plasma and radicals. Then, the plasma and the gas containing part of the radicals may be supplied substantially evenly from the through-holes JA2 onto the substrate W mounted on the stage MA11. The gas from the gas supply DB7 is supplied substantially evenly from the gas discharge holes JA3a onto the substrate W mounted on the stage MA11.

The void JA3 and the gas discharge holes JA3a do not communicate with the through-holes JA2. The first gas flow path from the gas supply UC3 and the second gas flow path from the gas supply DB7 are provided independently of each other. Since the first gas flow path and the second gas flow path are provided independently in this way, two types of gases that react with each other can be suitably supplied through the use of the first gas flow path and the second gas flow path.

The configuration of the plasma processing apparatus 1C3 will be described with reference to FIG. 5. At least one gas discharge hole JA3a is provided on the side wall DA11 of the plasma processing apparatus 1C3. The space SP includes an upper space SP1 and a lower space SP2. The gas discharge hole JA3a communicates with the upper space SP1 between the stage MA11 and the high frequency shield JA1b, and is arranged above the stage MA11. The lower space SP2 is provided between the high frequency shield JA1b and the stage MA11.

The gas discharge hole JA3a is connected to an external gas supply DB7 (second gas supply) and is included in a second gas flow path extending from the gas supply DB7. The gas from the gas supply DB7 is supplied from the gas discharge hole JA3a to the space between the stage MA11 and the high frequency shield JA1b.

The stage MA11 of the plasma processing apparatus 1C3 is rotated about the axis AX as a rotation axis by the drive mechanism of the stage MA11. The gas from the gas supply DB7 may be supplied substantially evenly onto the substrate W mounted on the stage MA11 from one or more gas discharge holes JA3a by the rotation of the stage MA11 in a state in which the stage MA11 is rotated about the axis AX.

The gas from the gas supply UC3 (first gas supply) is supplied to the upper space SP1 between the dielectric plate FA1 and the high frequency shield JA1b to generate plasma. Then, an ion gas contained in the plasma may be supplied substantially evenly from the through holes JA2 onto the substrate W mounted on the stage MA11.

The first gas flow path from the gas supply UC3 and the second gas flow path from the gas supply DB7 are provided independently of each other. Since the first gas flow path and the second gas flow path are provided independently in this way, two types of gases that react with each other may be suitably supplied through the use of the first gas flow path and the second gas flow path.

The configuration of the plasma processing apparatus 1C4 will be described with reference to FIG. 6. The plasma processing apparatus 1C4 is not connected to the gas supply DB7. The plasma processing apparatus 1C4 is supplied with a gas only from the gas supply UC3. The configuration of the plasma processing apparatus 1C4 is the same as the configuration of the plasma processing apparatus 1C3 except that it is not connected to the gas supply DB7.

The space SP includes an upper space SP1 and a lower space SP2. The gas from the gas supply UC3 is supplied to the upper space SP1 between the dielectric plate FA1 and the high frequency shield JA1b to generate plasma. Then, the ion gas contained in the plasma may be supplied substantially evenly from the through-holes JA2 onto the substrate W mounted on the stage MA11. The lower space SP2 is provided between the high frequency shield JA1b and the stage MA11.

Next, a specific example of the thickness distribution of the dielectric plate FA1 (shape of the upper surface UAg) will be described. Regardless of which of the following shows the thickness distribution of the dielectric plate FA1 (shape of the upper surface UAg), the thickness of the peripheral edge FA4 of the dielectric plate FA1 is substantially constant, and the upper surface UAg is substantially flat in the peripheral edge FA4.

Figure 8:
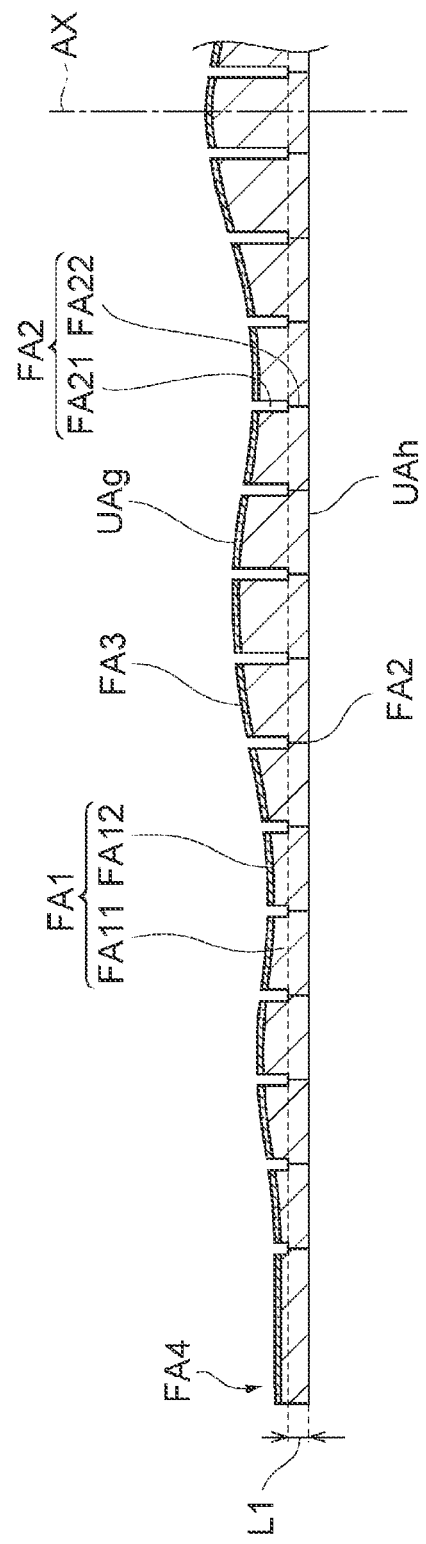
FIG. 8 is a diagram showing an example of a shape of a lower surface of an upper electrode shown in each of FIGS. 1 to 6.

The shape of the upper surface UAg may be, for example, a wavy curved surface, a step-like surface or the like (the same may be applied to the upper surface UAg shown in each of FIGS. 1 to 6). In this case, the wavy shape of the upper surface UAg may be adjusted to a shape that can reduce influence of harmonics generated by non-linear current-voltage characteristics of a plasma sheath. The wavy shape of the upper surface UAg may be the shape of the upper surface UAg shown in FIG. 8 as a specific example. In addition, the step-like shape of the upper surface UAg may be effective to avoid processing the upper surface UAg into a curved surface.

Figure 9:
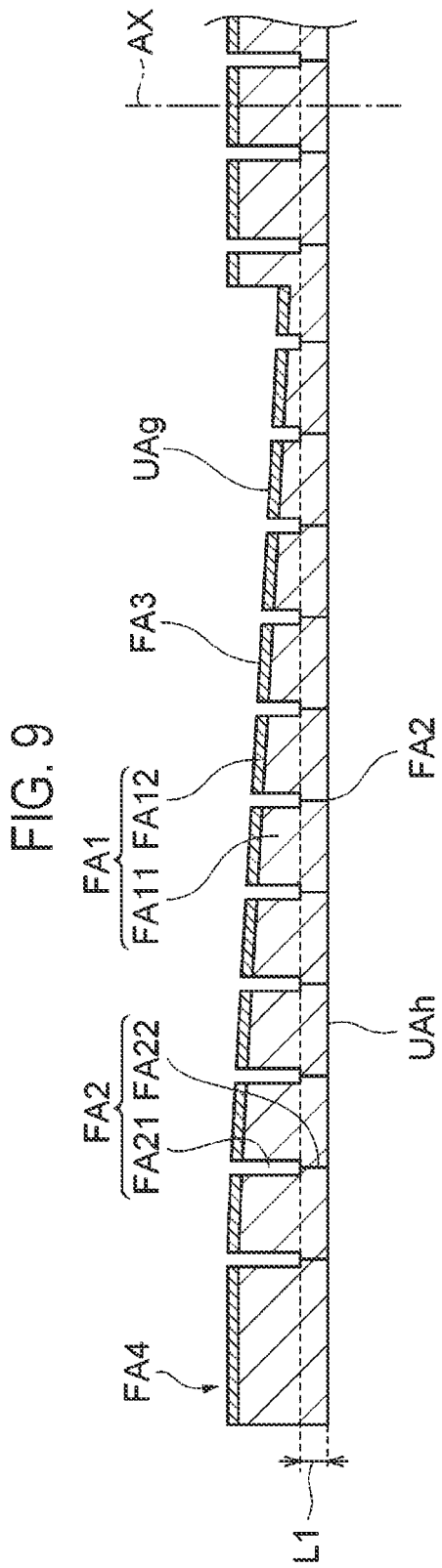
FIG. 9 is a diagram showing another example of the configuration of the dielectric plate shown in each of FIGS. 1 to 6.

Specific examples of the thickness distribution of the dielectric plate FA1 are shown in FIGS. 7 and 9 (the same may be applied to the upper surface UAg shown in each of FIGS. 1 to 6). The thickness distribution of the dielectric plate FA1 shown in FIG. 7 increases from the peripheral edge FA4 toward the center (portion intersecting the axis AX). The thickness of the dielectric plate FA1 shown in FIG. 7 is the largest on the axis AX (at the center of the dielectric plate FA1).

The configuration shown in each of FIGS. 1 to 8 is suitably used in a case where a frequency of the surface wave (radio waves) propagating in the radial direction between the plasma and the conductive film FA12 is in a VHF band, and ¼ of a wavelength of the surface waves is larger than a radius of the lower surface UAh of the dielectric plate FA1. As described above, the surface wave is a radio wave propagating between the dielectric plate FA1 and the plasma generated in the space SP when the plasma is generated.

As described above, the thickness of the dielectric plate FA1 shown in FIG. 7 increases from the peripheral edge FA4 toward the center (portion intersecting the axis AX). Therefore, generation of standing waves due to the surface waves can be suppressed, and an increase (non-uniformity) in a high frequency voltage generated between the dielectric plate FA1 and the plasma generated in the space SP at the time of plasma generation can be suppressed.

Further, the thickness distribution of the dielectric plate FA1 may be a distribution which is substantially constant in a first region extending from the peripheral edge FA4 of the dielectric plate FA1 to the vicinity of the axis AX and which increases from a boundary of the first region toward the axis AX in a second region near the axis AX. When the thickness of the dielectric plate FA1 is relatively large in the second region as described above, the propagation of the surface waves can be suppressed and the concentration of the surface waves in the vicinity (center) of the axis AX can also be suppressed.

In the thickness distribution of the dielectric plate FA1 shown in FIG. 9, the thickness of the dielectric plate FA1 decreases from the peripheral edge FA4 toward the center (portion intersecting the axis AX). The thickness of the dielectric plate FA1 shown in FIG. 9 is the largest on the side of the peripheral edge FA4.

The thickness distribution of the dielectric plate FA1 shown in FIG. 9 is suitably used in the case where the frequency of the surface wave (radio wave) is in a UHF band and ¼ of a wavelength of the surface wave is smaller than the radius of the upper surface UAg of the dielectric plate FA1.

As described above, the thickness of the dielectric plate FA1 shown in FIG. 9 decreases from the peripheral edge FA4 toward the center (portion intersecting the axis AX). Therefore, at the time of plasma generation, attenuation of the surface waves (radio waves) propagating between the dielectric plate FA1 and the plasma generated in the space SP can be suppressed, and a decrease in the high frequency voltage generated between the dielectric plate FA1 and the plasma generated in the space SP can be suppressed.

The conductive film FA12 may not be provided on the upper surface UAg in the center (portion having a relatively large thickness) of the dielectric plate FA1. In this case, the protrusion EA4 of the upper electrode UA21 may come into direct contact with the main body FA11 of the dielectric plate FA1.

The choice of which thickness distribution of the dielectric plate FA1 to be used from the thickness distribution of the dielectric plate FA1 shown in FIG. 7 and the thickness distribution of the dielectric plate FA1 shown in FIG. 9 will be described. Whether to use the thickness distribution shown in FIG. 7 or the thickness distribution shown in FIG. 9 may be determined depending on which one of the ¼ of the wavelength λ of the surface waves and a radius L of the lower surface UAh of the dielectric plate FA1 (radius of an plasma excitation area) is larger.

The wavelength λ (cm) of the surface wave is approximately equal to a value (quotient) which is obtained by dividing, by the square of the plasma excitation frequency f (MHz), a value obtained by multiplying the square root of the electron density ne (cm$^{-3}$) in the vicinity of the lower surface UAh of the dielectric plate FA1 in the space SP by 9.6. In this case, the wavelength λ (cm) is calculated, for example, by using the electron temperature of 3 eV near the lower surface UAh of the dielectric plate FA1 in the space SP, the electron density of $1 \times 10^{11}$ cm$^{-3}$, and the sheath width of 15 times of the Debye length.

When λ/4>L, standing waves in which the axis AX serves as an antinode is likely to be generated. Thus, the surface wave is unlikely to be attenuated. Therefore, the thickness distribution of the dielectric plate FA1 shown in FIG. 7 is appropriate. When λ/4<L, the surface wave attenuation is likely to occur. Therefore, the thickness distribution of the dielectric plate FA1 shown in FIG. 9 is appropriate.

Since the above-mentioned λ (cm) is inversely proportional to a square off (MHz), impact off (MHz) on the propagation of the surface wave is relatively large. Therefore, regardless of which one of the thickness distribution shown in FIG. 7 and the thickness distribution shown in FIG. 9 is used, the distribution of plasma in the radial direction of plasma (direction intersecting the axis AX and the radial direction of the dielectric plate FA1) can be adjusted by adjusting λ (cm). In order to adjust the radial distribution of plasma, f (MHz) may be continuously changed, or a plurality off (MHz) may be applied so that the power ratio thereof is changed.

Figure 10:
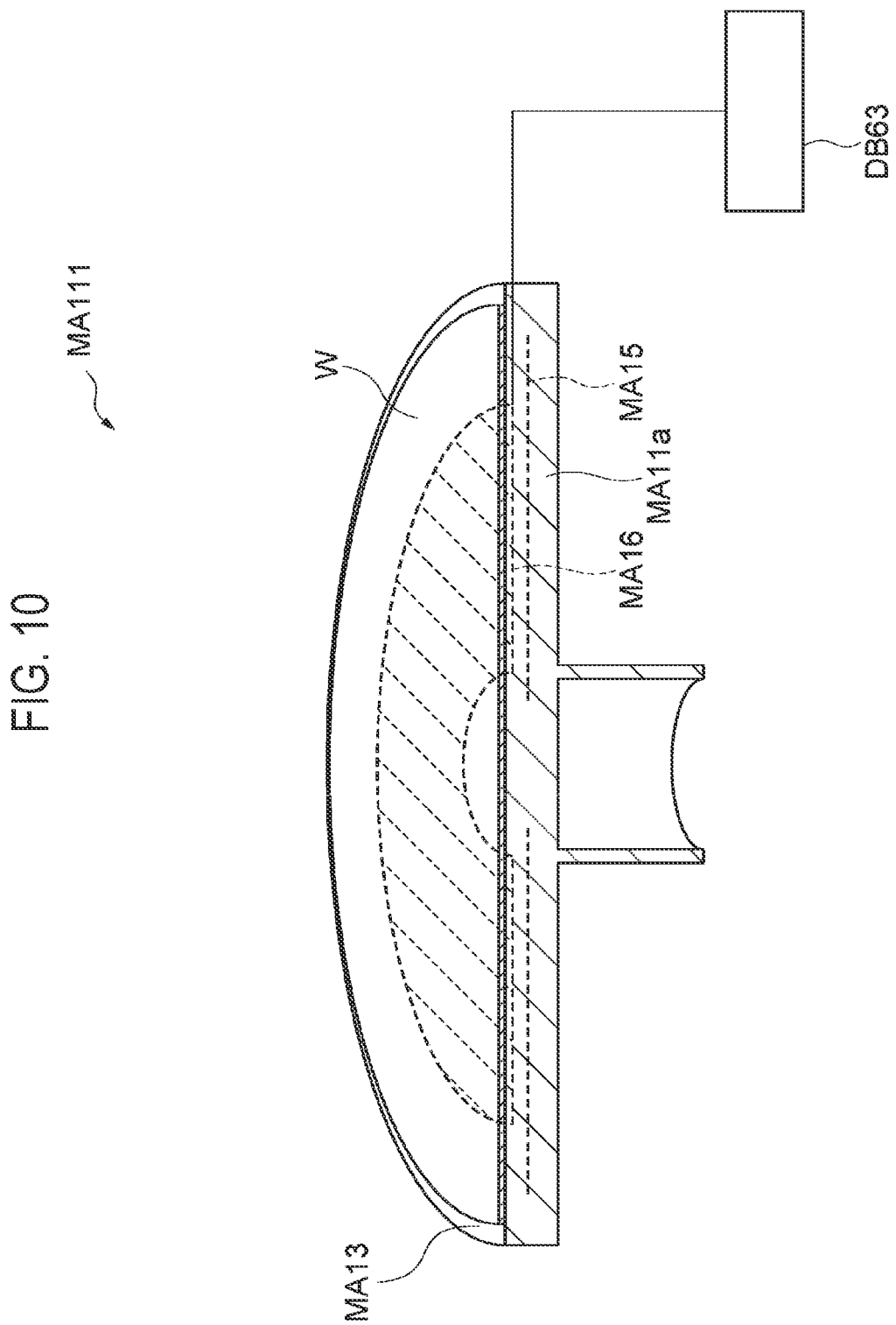
FIG. 10 is a diagram showing another example of a configuration of a stage shown in each of FIGS. 1 to 6.

Hereinafter, FIG. 10 will be mainly referred to. The plasma processing apparatus 1A described above may include a stage MA111 instead of the stage MA11. The stage MA111 is provided inside the processing container CS.

Similar to the stage MA11 of the plasma processing apparatus 1A, the stage MA111 includes a main body MA11a and a conductive layer MA15. The conductive layer MA15 is provided in the main body MA11a.

In one embodiment, the conductive layer MA15 may be a heater (resistive heating element). In this embodiment, the conductive layer MA15 may include, for example, a heater member MA15a and a heater member MA15b as in the case of the plasma processing apparatus 1A. The heater member MA15a is electrically connected to a heater power source DB62a via a common mode filter DB61a. The heater member MA15b is electrically connected to a heater power source DB62b via a common mode filter DB61b.

The stage MA111 further includes a conductive layer MA16. The conductive layer MA16 is provided in the main body MA11a. A DC power source DB63 may be electrically connected to the conductive layer MA16.

A distance between the conductive layer MA15 and the upper surface MA13 of the stage MA111 is larger than a distance between the conductive layer MA16 and the upper surface MA13 of the stage MA111. That is, the distance between the conductive layer MA16 and the upper surface MA13 of the stage MA111 is the shortest among distances between the respective conductive layers and the upper surface MA13 of the stage MA111.

The conductive layer MA16 is formed in a ring-shaped region in the main body MA11a. A central axis of the ring-shaped region substantially coincides with the axis AX. An inner diameter of the ring-shaped region is, for example, ⅙ (50 mm) or more of a diameter of the substrate W. An outer diameter of the ring-shaped region is smaller than the diameter of the substrate W. The conductive layer MA16 may be formed in a mesh shape.

Among one or more conductive layers provided in the stage MA111, the conductive layer MA16 has the shortest distance from the upper surface MA13 of the stage MA111. The conductive layer MA16 may be any one of an electrode for generating an electrostatic attraction between the stage MA111 and the substrate W mounted on the stage MA111, an electrode to which high frequency waves are supplied, and an electrode to be grounded. The conductive layer MA16 is formed in a ring shape.

A material of the main body MA11a may be an insulator (dielectric material) such as aluminum nitride, aluminum oxide or the like. A material of the conductive layer MA16 may be metal such as tungsten, molybdenum or the like.

As described above, among the one or more conductive layers provided in the stage MA111, the conductive layer MA16 having the shortest distance from the upper surface MA13 of the stage MA111 is formed in a ring shape. Accordingly, a high frequency bias that is unevenly applied to the substrate W mounted on the stage MA111 can be suppressed.

Figure 11:
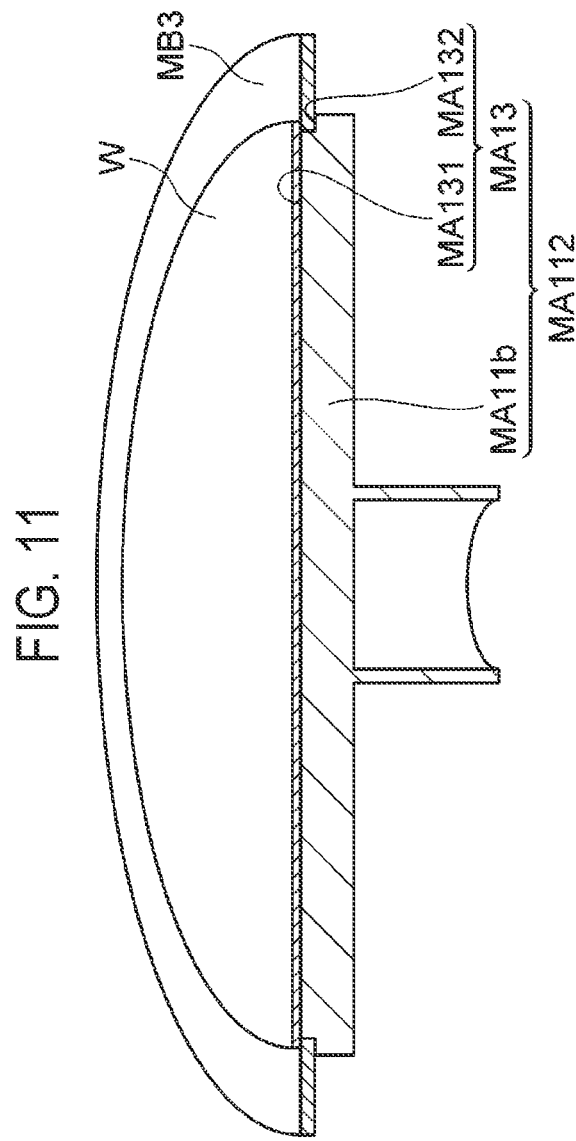
FIG. 11 is a diagram showing yet another example of the configuration of the stage shown in each of FIGS. 1 to 6.

Hereinafter, FIG. 11 will be mainly referred to. The plasma processing apparatus 1A described above may include a focus ring MB3 instead of the baffle member MB1. The plasma processing apparatus 1A described above may include a stage MA112 instead of the stage MA11.

The stage MA112 is provided in the processing container CS. The stage MA112 includes a main body MA11b.

A material of the stage MA112 may be metal such as aluminum, aluminum alloy or the like. The stage MA112 may have a substantially disk-like shape. A central axis of the stage MA112 substantially coincides with the axis AX.

The focus ring MB3 is provided on the upper surface MA13 of the stage MA112. The focus ring MB3 extends along a peripheral edge of the upper surface MA13. An inner diameter of the focus ring MB3 is smaller than a diameter of the upper surface MA13 of the stage MA112.

The upper surface MA13 of the stage MA112 includes a substrate mounting region MA131 and a focus ring mounting region MA132. The substrate mounting region MA131 is a substantially circular region. The substrate W is mounted on the substrate mounting region MA131. A diameter of the substrate mounting region MA131 is smaller than the diameter of the substrate W.

The focus ring mounting region MA132 extends radially outside the substrate mounting region MA131. A vertical position of the focus ring mounting region MA132 is lower than a vertical position of the substrate mounting region MA131.

The focus ring MB3 is mounted on the focus ring mounting region MA132. The focus ring MB3 has a ring shape and forms a plate shape.

The focus ring MB3 is formed of a dielectric material. More specifically, a material of the focus ring MB3 may be aluminum oxide, quartz or the like. The focus ring MB3 is mounted on the focus ring mounting region MA132 so that an upper surface of an inner edge thereof faces a lower surface of an edge of the substrate W.

According to the stage MA112, the focus ring MB3 suppresses the generation of a high-frequency electric field between the center and the outer peripheral of the stage MA112.

In case of high frequency waves in the VHF band or the UHF band, the generation of standing waves may reduce uniformity of plasma in a direction in which the lower surface UAh of the dielectric plate FA1 extends. However, according to the various exemplary embodiments described above, the dielectric plate FA1 provided below the upper electrode UA21 includes the conductive film FA12, and the conductive film FA12 is electrically connected to the upper electrode UA21 (upper electrode UA21a) provided on the upper surface UAg of the dielectric plate FA1. Therefore, the dielectric plate FA1, in high frequency waves, can function as a capacitor connected to the upper electrode UA21 (upper electrode UA21a). Accordingly, the generation of the standing wave can be suppressed and a gradient of an electric field in the vicinity of the upper electrode UA21 (upper electrode UA21a) (more specifically, the dielectric plate FA1) in the space SP can be reduced. Accordingly, the uniformity of plasma can be improved.

Further, the dielectric plate FA1 has a thickness distribution in the radial direction of the dielectric plate FA1. Therefore, the thickness of the dielectric plate FA1 has a thickness distribution (has a non-uniform thickness) in the radial direction of the dielectric plate FA1 (direction in which the dielectric plate FA1 extends). That is, the thickness of the dielectric plate FA1 can be adjusted so as to suppress the generation of standing waves. In particular, when the high frequency in the VHF band or the UHF band is radiated into the space SP, the thickness of the dielectric plate FA1 can be adjusted. By this adjustment, the wavelength of the surface wave (radio wave) propagating between the upper electrode UA21 (upper electrode UA21a) (more specifically, the dielectric plate FA1) and the plasma generated in the space SP at the time of plasma generation may suitably increase. Accordingly, it is possible to further improve the uniformity of the plasma.

A plasma processing method using the above-above-described plasma processing apparatuses 1A, 1B and 1C1 to 1C4 will be described. In this method, plasma processing is performed in a state in which the conductive film FA12 is provided on the upper surface UAg of the dielectric plate FA1 facing the upper electrode UA21 and the upper electrode UA21a, and in which the conductive film FA12 is electrically connected to the upper electrode UA21 and the upper electrode UA21a.

Although various exemplary embodiments have been described above, the present disclosure is not limited to the above-described exemplary embodiments. Various omissions, substitutions and changes may be made. It is also possible to combine the elements of different exemplary embodiments to form other exemplary embodiments.

From the above description, it is understood that various exemplary embodiments of the present disclosure are described herein for the sake of explanation and that various modifications may be made without departing from the scope and spirit of the present disclosure. Accordingly, the various exemplary embodiments disclosed herein are not intended to be limiting and the true scope and spirit is indicated by the appended claims.

EXPLANATION OF REFERENCE NUMERALS

1A: plasma processing apparatus, 1B: plasma processing apparatus, 1C1: plasma processing apparatus, 1C2: plasma processing apparatus, 1C3: plasma processing apparatus, 1C4: plasma processing apparatus, AX: axis, CS: processing container, DA11: side wall, DA11a: exhaust port, DA12: projection portion, DA13: sealing member, DA2: inlet/outlet part, DB11: support portion, DB12: exhaust pipe, DB21: bellows, DB22: bellows, DB3: spring, DB4: water-cooled plate, DB5: gas supply, DB6: heater power source, DB61a: common mode filter, DB61b: common mode filter, DB62a: heater power source, DB62b: heater power source, DB63: DC power source, DB7: gas supply, EA1: cavity, EA2: hole, EA3: space, EA4: projection portion, EA5: region, FA1: dielectric plate, FA11: main body, FA12: conductive film, FA2: gas discharge hole, FA21: upper hole, FA22: lower hole, FA3: region, FA4: peripheral edge portion, GA1: sealing member, GA2: sealing member, HA1: conductive elastic member, HA2: elastic member, JA1a: high frequency shield, JA1b: high frequency shield, JA2: through-hole, JA3: void, JA3a: gas discharge hole, L1: length, MA11: stage, MA111: stage, MA112: stage, MA11a: main body, MA11b: main body, MA12: peripheral edge portion, MA13: upper surface, MA131: substrate mounting region, MA132: focus ring mounting region, MA14: back surface, MA15: conductive layer, MA15a: heater member, MA15b: heater member, MA16: conductive layer, MA21: conductive portion, MA22: conductive plate, MA23: conductive elastic member, MA24: pin, MA31: exhaust chamber, MA32: wall portion, MA33: vent, MB1: baffle member, MB3: focus ring, SP: space, SP1: upper space, SP2: lower space, UAL waveguide wall, UA21: upper electrode, UA21a: upper electrode, UA24: peripheral edge portion, UA31: waveguide, UA32: end portion, UA4: insulating member, UA51: support ring, UA52: covering, UA81: elastic member, UA82: sealing member, UA9: pipe, UAf: lower surface, UAg: upper surface, UAh: lower surface, UC1: high frequency power source, UC2: matcher, UC3: gas supply, UC31: gas pipe, W: substrate

What is claimed is:

1. A plasma processing apparatus, comprising:
a processing container;
a stage;
an upper electrode;
a dielectric plate; and
a waveguide,
wherein the stage is provided in the processing container,
the dielectric plate is provided above the stage with a space in the processing container interposed therebetween,
the upper electrode is provided above the dielectric plate,
the waveguide has an end and guides high frequency waves in a VHF band or a UHF band,
the end is arranged to face the space to radiate the high frequency waves to the space,
the dielectric plate includes a conductive film,
the conductive film is provided on an upper surface of the dielectric plate,
the upper surface faces the upper electrode, and
the conductive film is electrically connected to the upper electrode.

2. The apparatus of claim 1, wherein the dielectric plate has a thickness distribution in a radial direction of the dielectric plate.

3. The apparatus of claim 2, wherein a thickness of the dielectric plate increases from a peripheral edge of the dielectric plate to a center of the dielectric plate.

4. The apparatus of claim 1, wherein a thickness of the dielectric plate increases from a peripheral edge of the dielectric plate to a center of the dielectric plate.

5. The apparatus of claim 1, wherein a thickness of the dielectric plate decreases from a peripheral edge of the dielectric plate to a center of the dielectric plate.

6. The apparatus of claim 1, wherein the upper surface of the dielectric plate has a wavy shape.

7. The apparatus of claim 1, wherein the upper electrode includes a projection portion,
the projection is provided between the upper electrode and the dielectric plate, and
the projection is thermally connected to the dielectric plate.

8. The apparatus of claim 1, wherein the dielectric plate is a shower plate.

9. The apparatus of claim 8, wherein the dielectric plate includes a plurality of gas discharge holes,
the gas discharge holes include upper holes and lower holes communicating with each other, and penetrate the dielectric plate from the upper surface of the dielectric plate to a lower surface of the dielectric plate exposed to the space,
the upper holes are provided on the upper surface,
the lower holes are provided on the lower surface,
a diameter of the upper holes is larger than a diameter of the lower holes, and lengths of the lower holes in the gas discharge holes are aligned with each other.

10. The apparatus of claim 9, further comprising:
a high frequency shield,
wherein the high frequency shield includes a plurality of through-holes and a plurality of gas holes, and is provided between the stage and the dielectric plate to extend along the stage,
the through-holes are included in a first gas flow path extending from an external first gas supply through the gas discharge holes of the dielectric plate, and communicate a space between the stage and the high frequency shield with a space between the high frequency shield and the dielectric plate, and
the gas holes are included in a second gas flow path extending from an external second gas supply, and communicate with the space between the stage and the high frequency shield.

11. The apparatus of claim 9, further comprising:
a high frequency shield,
wherein the high frequency shield includes a plurality of through-holes, and is provided between the stage and the dielectric plate to extend along the stage,
the through-holes are included in a first gas flow path extending from an external first gas supply through the gas discharge holes of the dielectric plate, and communicate a space between the stage and the high frequency shield with a space between the high frequency shield and the dielectric plate,
the processing container is provided with a plurality of gas holes, and
the gas holes are included in a second gas flow path extending from an external second gas supply, communicate with a space between the stage and the high frequency shield, and are arranged along a peripheral edge of the stage above the stage.

12. The apparatus of claim 9, further comprising:
a high frequency shield,
wherein the high frequency shield includes a plurality of through-holes, and is provided between the stage and the dielectric plate to extend along the stage,
the through-holes are included in a first gas flow path extending from an external first gas supply through the gas discharge holes of the dielectric plate, and communicate a space between the stage and the high frequency shield with a space between the high frequency shield and the dielectric plate,
the processing container is provided with a plurality of gas holes, and
the gas holes are included in a second gas flow path extending from an external second gas supply, communicate with a space between the stage and the high frequency shield, and are arranged above the stage.

13. The apparatus of claim 9, further comprising:
a high frequency shield,
wherein the high frequency shield includes a plurality of through-holes, and is provided between the stage and the dielectric plate to extend along the stage, and
the through-holes are included in a first gas flow path extending from an external first gas supply through the gas discharge holes of the dielectric plate, and communicate a space between the stage and the high frequency shield with a space between the high frequency shield and the dielectric plate.

14. The apparatus of claim 1, wherein the stage includes a main body formed of an insulator and a conductive layer provided in the main body, and the conductive layer has a shortest distance from the upper surface of the stage among one or more conductive layers provided in the stage, and is formed in a ring shape.

15. The apparatus of claim 14, wherein the conductive layer has an outer diameter that is smaller than a diameter of a substrate mounted on the stage.

16. The apparatus of claim 14, wherein the conductive layer is any one of an electrode for generating an electrostatic attraction between and a substrate placed on the stage and the stage, an electrode to which the high frequency waves are supplied and an electrode that is grounded.

17. The apparatus of claim 14, wherein the conductive layer is formed into a mesh shape.

18. The apparatus of claim 14, further comprising:
a focus ring,
wherein the focus ring is formed of a dielectric material, provided on the upper surface of the stage and is extended along a peripheral edge of the upper surface of the stage, and
the focus ring has an inner diameter smaller than a diameter of the upper surface of the stage.

19. The apparatus of claim 1, wherein a peripheral edge of the dielectric plate and a peripheral edge of the upper electrode are connected to each other by a pressure through an elastic member.

20. A plasma processing method for performing plasma processing on a processing target object using a plasma processing apparatus, wherein an upper electrode, a dielectric plate, a stage and a waveguide are provided in a processing container of the plasma processing apparatus, the dielectric plate is provided above the stage with a space in the processing container interposed therebetween, the upper electrode is provided above the dielectric plate, and an end of the waveguide is arranged to face the space to radiate high frequency waves in a VHF band or a UHF band into the space, the method comprising:

performing plasma processing in a state in which a conductive film is provided on an upper surface of the dielectric plate facing the upper electrode and is electrically connected to the upper electrode.

* * * * *